United States Patent
Jung et al.

(10) Patent No.: US 12,108,551 B2
(45) Date of Patent: Oct. 1, 2024

(54) ELECTRONIC DEVICE INCLUDING HINGE STRUCTURE

(71) Applicant: Samsung Electronics Co., Ltd., Gyeonggi-do (KR)

(72) Inventors: Iksu Jung, Gyeonggi-do (KR); Jinho Lim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 159 days.

(21) Appl. No.: 17/735,566

(22) Filed: May 3, 2022

(65) Prior Publication Data
US 2022/0361350 A1 Nov. 10, 2022

Related U.S. Application Data

(63) Continuation of application No. PCT/KR2022/005905, filed on Apr. 26, 2022.

(30) Foreign Application Priority Data

May 6, 2021 (KR) .......................... 10-2021-0058354

(51) Int. Cl.
*H05K 5/00* (2006.01)
*F16C 11/04* (2006.01)
*H05K 5/02* (2006.01)

(52) U.S. Cl.
CPC ............ *H05K 5/0226* (2013.01); *F16C 11/04* (2013.01); *H05K 5/0017* (2013.01)

(58) Field of Classification Search
None
See application file for complete search history.

(56) References Cited

U.S. PATENT DOCUMENTS 8,688,178 B2    4/2014  Kusano
9,348,450 B1 *  5/2016  Kim ................... H04M 1/0268
(Continued)

FOREIGN PATENT DOCUMENTS

CN    110849257 A    2/2020
EP     4283432 A1   11/2023
(Continued)

OTHER PUBLICATIONS

International Search Report dated Aug. 10, 2022.
Extended European Search Report dated Jun. 28, 2024.

*Primary Examiner* — Anthony Q Edwards
*Assistant Examiner* — Rashen E Morrison
(74) *Attorney, Agent, or Firm* — Cha & Reiter, LLC

(57) ABSTRACT

An electronic device includes a first and second housing, a sensor module, and a hinge. The hinge includes first and second rotary members, a first arm rotatable about a first arm shaft, operating in conjunction with rotation of the first rotary member, wherein a rotational axis of the first arm shaft is different from the first axis of rotation, a second arm shaft rotatable about a second arm shaft, operating in conjunction with rotation of the second rotary member, wherein a rotational axis of the second arm shaft is different from the second axis of rotation, and a magnet assembly disposed on at least one of the first arm member or the second arm member such that at least a portion of the magnet assembly faces the sensor, wherein a distance between the magnet and the sensor is changeable based on rotation of the first and second housing.

20 Claims, 19 Drawing Sheets

(56) References Cited

U.S. PATENT DOCUMENTS

| | | | |
|---|---|---|---|
| 9,474,345 B2 * | 10/2016 | Smith | H04B 1/3888 |
| 10,340,969 B2 | 7/2019 | Smith et al. | |
| 10,558,277 B2 | 2/2020 | Henell | |
| 10,775,852 B2 | 9/2020 | Kim et al. | |
| 10,845,850 B1 | 11/2020 | Kang et al. | |
| 10,901,468 B2 * | 1/2021 | Xia | G06F 1/165 |
| 11,231,754 B2 | 1/2022 | Kang et al. | |
| 11,300,995 B2 | 4/2022 | Eom et al. | |
| 2010/0234073 A1 | 9/2010 | Kusano | |
| 2015/0049426 A1 | 2/2015 | Smith et al. | |
| 2018/0039339 A1 | 2/2018 | Jenell | |
| 2019/0166703 A1 | 5/2019 | Kim et al. | |
| 2019/0354148 A1 * | 11/2019 | Delano | G06F 1/203 |
| 2020/0340794 A1 | 10/2020 | Park | |
| 2021/0041912 A1 | 2/2021 | Eom et al. | |
| 2022/0113770 A1 | 4/2022 | Kang et al. | |
| 2023/0297133 A1 | 9/2023 | Lee et al. | |
| 2023/0400886 A1 | 12/2023 | Lee et al. | |

FOREIGN PATENT DOCUMENTS

| | | |
|---|---|---|
| JP | 2004-177327 A | 6/2004 |
| JP | 2020-46602 A | 3/2020 |
| KR | 10-2019-0062107 A | 6/2019 |
| KR | 10-2020-0126315 A | 11/2020 |
| KR | 10-2020-0126524 A | 11/2020 |
| KR | 10-2021-0017038 A | 2/2021 |
| WO | 2022/119249 A1 | 6/2022 |

* cited by examiner

ELECTRONIC DEVICE INCLUDING HINGE STRUCTURE

CROSS-REFERENCE TO RELATED APPLICATION(S)

This application is a Continuation of and claims priority under 35 U.S.C. § 120 to PCT International Application No. PCT/KR2022/005905, which was filed on Apr. 26, 2022, and claims priority to Korean Patent Application No. 10-2021-0058354, filed on May 6, 2021, in the Korean Intellectual Property Office, the disclosures of which are incorporated by reference herein their entirety.

BACKGROUND

Technical Field

Certain embodiments of the disclosure described herein relate to a foldable electronic device, and, more particularly, to a foldable electronic device capable of detecting a folding state.

Description of Related Art

A portable electronic device such as a smartphone may provide a variety of functions, such as telephonic calling, video playback, Internet searching, and the like, as provided through a variety of applications. Users often prefer using wider displays to access applications and other such functions. However, the portability of these devices may suffer when a device incorporates a larger display screen. Accordingly, foldable electronic devices have been introduced, which include configurable housings and flexible displays, a portion of which may deformable to be curved or flat. A hinge may be used to assist with folding and unfolding.

The hinge may further allow pivoting of housing components of the device. The hinge(s) may allow folding through or at predetermined angles. As the housings rotate relative to one another, the flexible display may be folded and unfolded. Further, the electronic device may detect a folded or unfolded state, and alter a display screen or operation based on the detected state.

SUMMARY

The foldable electronic device may determine a state using a magnet and a sensor (e.g., a Hall sensor) that senses a magnetic field of the magnet. The device may perform various operations based on detected state of the electronic device. The magnet may be disposed in a hinge housing, and the sensor may be disposed in a housing. When the magnet and the sensor are disposed in such a way, due to a set distance between the magnet and the sensor, the strength of the magnetic field of the magnet as detected by the sensor may be insufficient, which may hinder accurate detection of the state of the electronic device.

Certain embodiments of the disclosure provide an electronic device for accurately sensing a state (e.g., a folding angle) of the electronic device through a magnet and a sensor disposed within a threshold proximity to each other.

An electronic device according to an embodiment of the disclosure includes a first housing, a second housing, a sensor module including a sensor, the sensor module disposed in at least one of the first housing or the second housing, a hinge structure rotatably connecting the first housing and the second housing, wherein the hinge structure includes a first rotary member connected to the first housing and configured to rotate about a first axis of rotation together with the first housing, a second rotary member connected to the second housing and configured to rotate about a second axis of rotation together with the second housing, a first arm member coupled to and rotatable about a first arm shaft, the first arm member configured to operate in conjunction with rotation of the first rotary member, wherein a rotational axis of the first arm shaft is different from the first axis of rotation, a second arm member coupled and rotatable about a second arm shaft, the second arm member configured to operate in conjunction with rotation of the second rotary member, wherein a rotational axis of the second arm shaft is different from the second axis of rotation, a magnet assembly including a magnet, the magnet assembly disposed on at least one of the first arm member or the second arm member such that at least a portion of the magnet assembly faces the sensor, and wherein a distance between the magnet and the sensor is changed in response to rotation of the first housing and the second housing.

[7] An electronic device according to an embodiment of the disclosure includes a first housing, a second housing, a flexible display spanning the first housing to the second housing, a hinge structure rotatably connecting the first housing and the second housing, a sensor disposed in the first housing, and configured to detect a strength and/or direction of a magnetic field, wherein the hinge structure includes: a fixed member, a first rotary member coupled to the fixed member so as to be rotatable about a first axis of rotation, the first rotary member operably connected to the first housing to rotate together with the first housing, a second rotary member coupled to the fixed member so as to be rotatable about a second axis of rotation, the second rotary member operably connected to the second housing to rotate together with the second housing, a first arm shaft coupled to the fixed member so as to be rotatable, the first arm shaft disposed parallel to the first axis of rotation, a second arm shaft coupled to the fixed member so as to be rotatable, the second arm shaft disposed parallel to the second axis of rotation, a first arm member coupled to the first arm shaft and rotatable together with the first arm shaft, wherein the first arm member includes a first cam at least partially surrounding the first arm shaft, a second arm member coupled to the second arm shaft and rotatable together with the second arm shaft, wherein the second arm member includes a second cam at least partially surrounding the second arm shaft, a cam member coupled to the first arm shaft and the second arm shaft and linearly movable in an axial direction parallel to the first and/or second axis of rotation, the cam member including a third cam engaged with the first cam, and a fourth cam engaged with the second cam, a first elastic member coupled to the first arm shaft and providing elastic force to the cam member in the axial direction, a second elastic member coupled to the second arm shaft and providing elastic force to the cam member in the axial direction, a magnet assembly including a magnet, the magnet assembly coupled to the first arm member so as to partially face the sensor, wherein in folding and unfolding motions of the electronic device, the first arm member operates in conjunction with rotation of the first rotary member and rotates along a path different from that of the first rotary member, and the second arm member operates in conjunction with rotation of the second rotary member and rotates along a path different from that of the second rotary member, and wherein a distance between the magnet and the sensor changes according to the folding and unfolding motions.

In the electronic device according to the certain embodiments of the disclosure, the magnet and the sensor may be disposed within a certain proximity to each other. Accordingly, the strength of the magnetic field sensed by the sensor may be sufficient as to enable accurate sensor-based detection of the same.

In the electronic device according to the certain embodiments of the disclosure, the magnet may be affixed using a magnet bracket made of a non-metallic material. Accordingly, magnetization of the hinge structure may be decreased.

In addition, the disclosure may provide various effects that are directly or indirectly recognized.

BRIEF DESCRIPTION OF THE DRAWINGS

With regard to description of the drawings, identical or similar reference numerals may be used to refer to identical or similar components.

DETAILED DESCRIPTION

Hereinafter, certain embodiments of the disclosure may be described with reference to accompanying drawings.

Accordingly, those of ordinary skill in the art will recognize that modification, equivalent, and/or alternative on the certain embodiments described herein can be variously made without departing from the scope of the disclosure.

Figure 1:
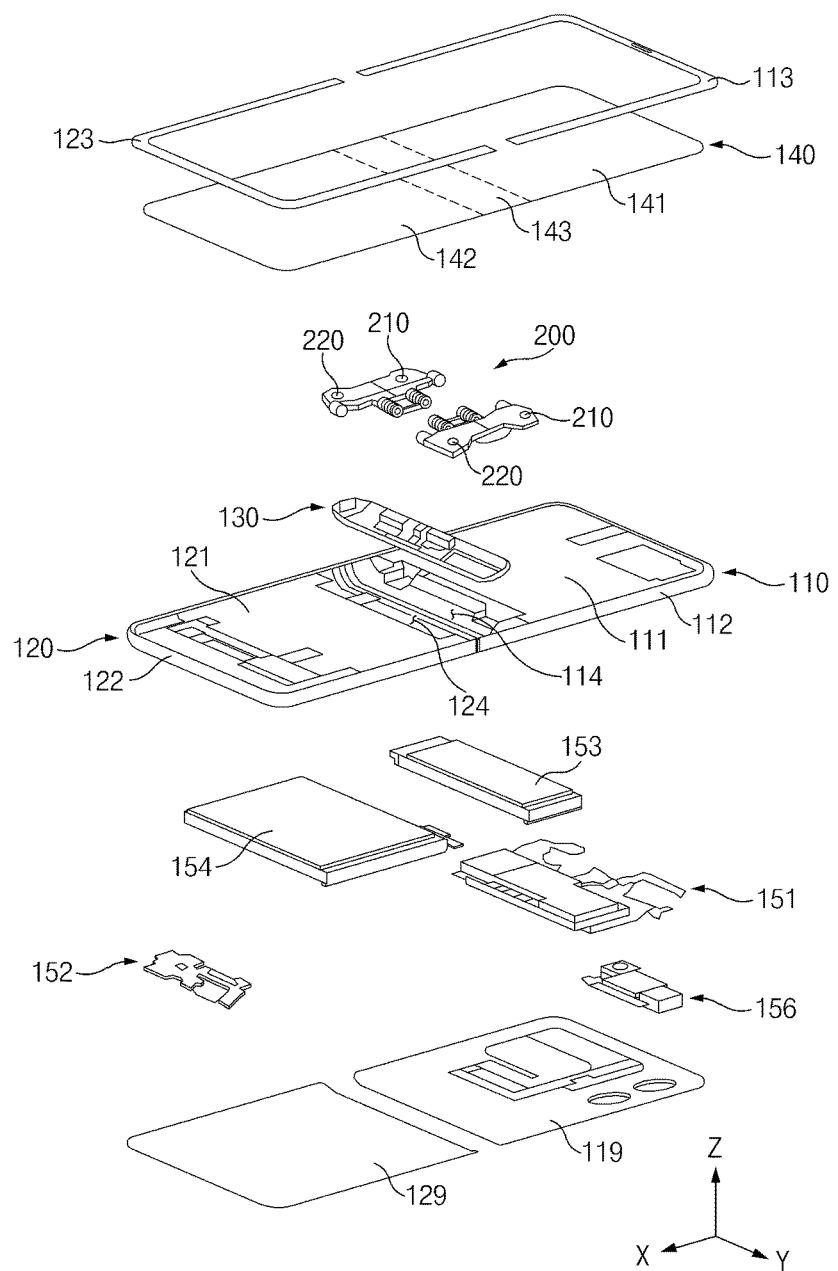
FIG. 1 is an exploded perspective view of an electronic device according to an embodiment.

FIG. 1 is an exploded perspective view of an electronic device according to an embodiment.

Referring to FIG. 1, the electronic device 100 according to an embodiment may include a first housing 110, a second housing 120, a hinge housing 130, a display 140, and a hinge structure 200.

In an embodiment, the first housing 110 may be connected with the second housing 120 by using the hinge structure 200. The first housing 110 may include a first plate 111 on which the display 140 is seated, and a first frame 112 surrounding at least a portion of the first plate 111. For example, the first frame 112 may form a portion of a surface (e.g., a side surface) of the electronic device 100. For example, at least a portion of a first area 141 of the display 140 and at least a portion of a folding area 143 of the display 140 may be disposed on the first plate 111. A first rotary member 210 of the hinge structure 200 may be connected to the first plate 111.

In an embodiment, at least a portion of the first housing 110 may be attached with the first area 141 of the display 140. Alternatively, a portion of the periphery of the front surface of the first housing 110 may be attached with the periphery of the first area 141 of the display 140. In this regard, an adhesive layer may be disposed between the first plate 111 of the first housing 110 and the first area 141 of the display 140.

In an embodiment, at least a portion of the inside of the first housing 110 may be provided in a hollow form (e.g., may define a hollow space within). A first circuit board 151, a first battery 153, and a camera module 156 may be disposed in the first housing 110. The first circuit board 151 and the first battery 153 may be electrically connected with a second circuit board 152 and a second battery 154 in the second housing 120 through a flexible circuit board (not illustrated). For example, the flexible circuit board (not illustrated) may extend from a partial area of the first housing 110 to a partial area of the second housing 120 across the hinge housing 130. A partial area of the flexible circuit board (not illustrated) may be located in the hinge housing 130. For example, a processor and memory may be disposed on the first circuit board 151. For example, the first battery 153 and the first circuit board 151 may be disposed on the first plate 111.

In an embodiment, at least a portion of the first housing 110 may be formed of a metallic material, or at least a portion of the first housing 110 may be formed of a non-metallic material. To support at least a portion of the display 140, the first housing 110 may be formed of a material having a predetermined rigidity. In an embodiment, a portion of the first housing 110 that faces the second housing 120 may include a depression 114, at least a portion of which may include a predetermined curvature such that the hinge housing 130 is disposed therein.

In certain embodiments, the first housing 110 may include a first decorative member 113 surrounding the periphery of the display 140 and a first back cover 119 facing the first plate 111 and forming a surface of the electronic device 100. For example, the first decorative member 113 may be disposed to cover the peripheral portion of the first area 141 of the display 140 and the periphery of a portion of the folding area 143. For example, in an unfolded state (e.g., refer to FIG. 2A), the first back cover 119 may form the rear surface of the electronic device 100, and the display 140 may form the front surface of the electronic device.

In an embodiment, the second housing 120 may be connected with the first housing 110 through the hinge structure 200. The second housing 120 may include a second plate 121 on which the display 140 is seated and a second frame 122 surrounding at least a portion of the second plate 121. For example, the second frame 122 may form a portion of a surface (e.g., the side surface) of the electronic device 100. For example, at least a portion of a second area 142 and at least a portion of the folding area 143 may be disposed on the second plate 121. A second rotary member 220 of the hinge structure 200 may be connected to the second plate 121.

In an embodiment, at least a portion of the second housing 120 may be attached with the second area 142 of the display 140. Alternatively, a portion of the periphery of the front surface of the second housing 120 may be attached with the periphery of the second area 142 of the display 140. In this regard, an adhesive layer may be disposed between the second plate 121 of the second housing 120 and the second area 142 of the display 140.

In an embodiment, at least a portion of the inside of the second housing 120 may be provided in a hollow form (e.g., define a hollow space within). The second circuit board 152 and the second battery 154 may be disposed in the second housing 120. The second circuit board 152 and the second battery 154 may be electrically connected with the first circuit board 151 and/or the first battery 153 in the first housing 110 through the flexible circuit board (not illustrated). For example, the second battery 154 and the second circuit board 152 may be disposed on the second plate 121.

In an embodiment, at least a portion of the second housing 120 may be formed of a metallic material, or at least a portion of the second housing 120 may be formed of a non-metallic material. To support at least a portion of the display 140, the second housing 120 may be formed of a material having a predetermined rigidity. In an embodiment, a portion of the second housing 120 that faces the first housing 110 may include a depression 124, at least a portion of which may include a predetermined curvature such that the hinge housing 130 is disposed therein.

In certain embodiments, the second housing 120 may include a second decorative member 123 surrounding a periphery of the display 140 and a second back cover 129 facing the second plate 121 and forming a surface of the electronic device 100. For example, the second decorative member 123 may be disposed to cover the peripheral portion of the second area 142 of the display 140 and the periphery of a portion of the folding area 143. For example, in an unfolded state (e.g., refer to FIG. 2A), the second back cover 129 may form the rear surface of the electronic device 100, and the display 140 may form the front surface of the electronic device.

In an embodiment, the hinge housing 130 may be disposed in the depression 114 of the first housing 110 and the depression 124 of the second housing 120. The hinge housing 130 may be disposed such that as a whole, it generally extends in the y-axis direction. A boss for fixing the hinge structure 200 may be disposed on a partial area of the inside surface of the hinge housing 130.

In an embodiment, at least a portion of the display 140 may include a degree of flexibility. For example, the display 140 may include the first area 141 at least partially disposed on the first housing 110, the second area 142 at least partially disposed on the second housing 120, and the folding area 143 located between the first area 141 and the second area 142.

In an embodiment, the first area 141 and the second area 142 may be formed to be flat, and the folding area 143 may be formed such that at least a portion thereof is deformable to be flat or curved. For example, the first area 141 and the second area 142 may remain flat regardless of a state of the electronic device 100, and the folding area 143 may be deformed to be curved or flat in response to a state of the electronic device 100.

In an embodiment, the hinge structure 200 may include the first rotary member 210 connected to the first housing 110 and the second rotary member 220 connected to the second housing 120. The hinge structure 200 may be configured such that the first rotary member 210 and the second rotary member 220 are rotatable about axes of rotation thereof (e.g., axes parallel to the y-axis direction). The first rotary member 210 may rotate together with the first housing 110, and the second rotary member 220 may rotate together with the second housing 120. For example, when the first housing 110 and the second housing 120 are folded or unfolded, the first rotary member 210 and the second rotary member 220 may rotate about the axes of rotation thereof.

Figure 2A:
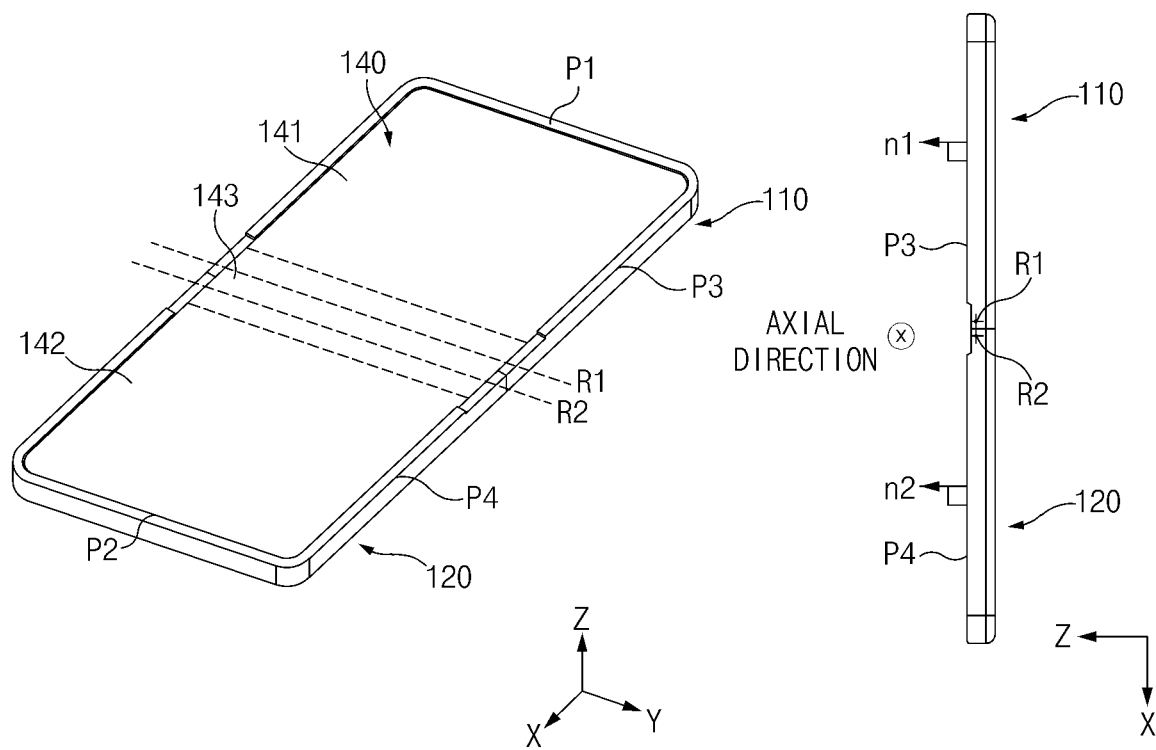
FIG. 2A illustrates an unfolded state of the electronic device according to an embodiment.
Figure 2B:
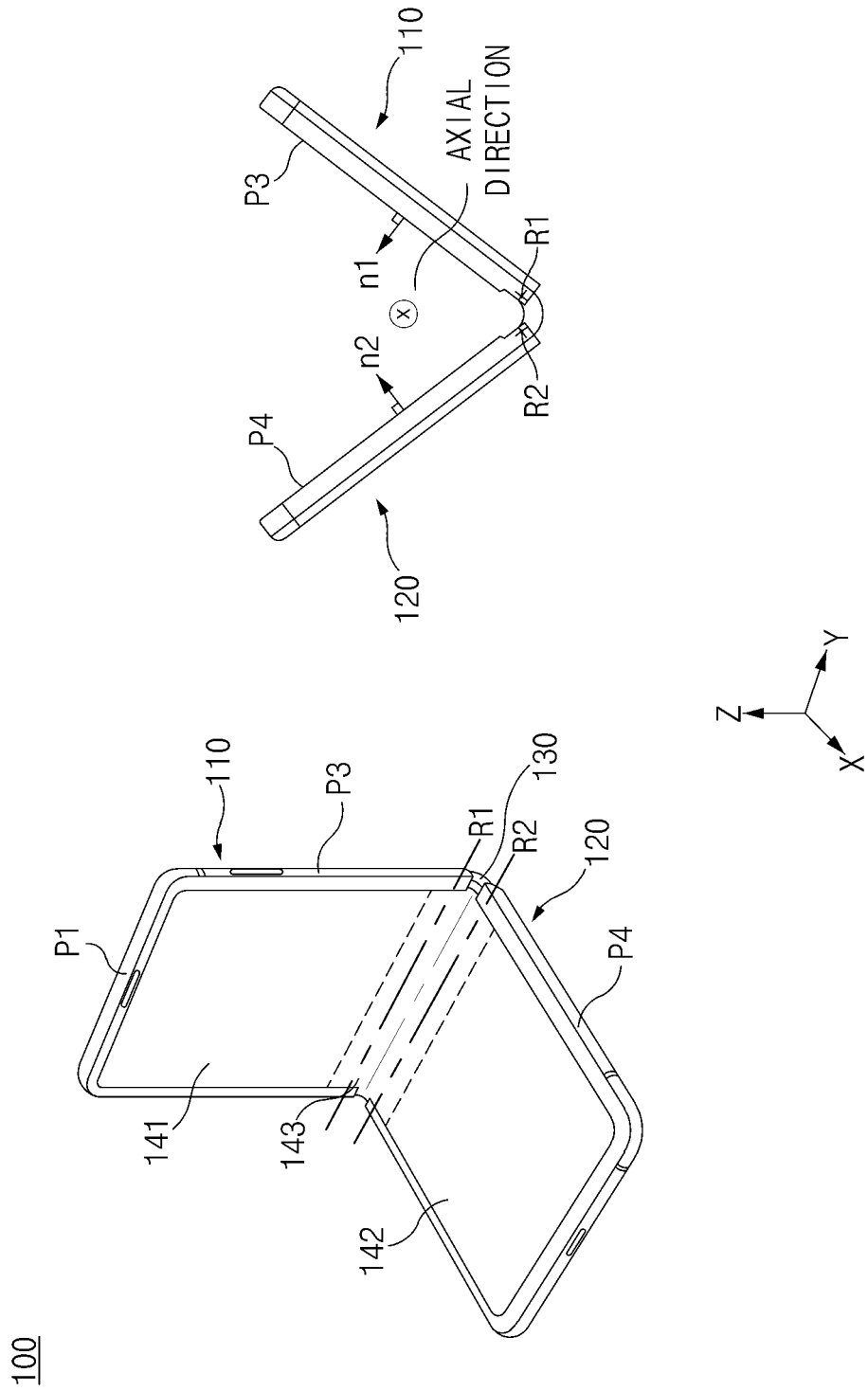
FIG. 2B illustrates an intermediate folded state of the electronic device according to an embodiment.
Figure 2C:
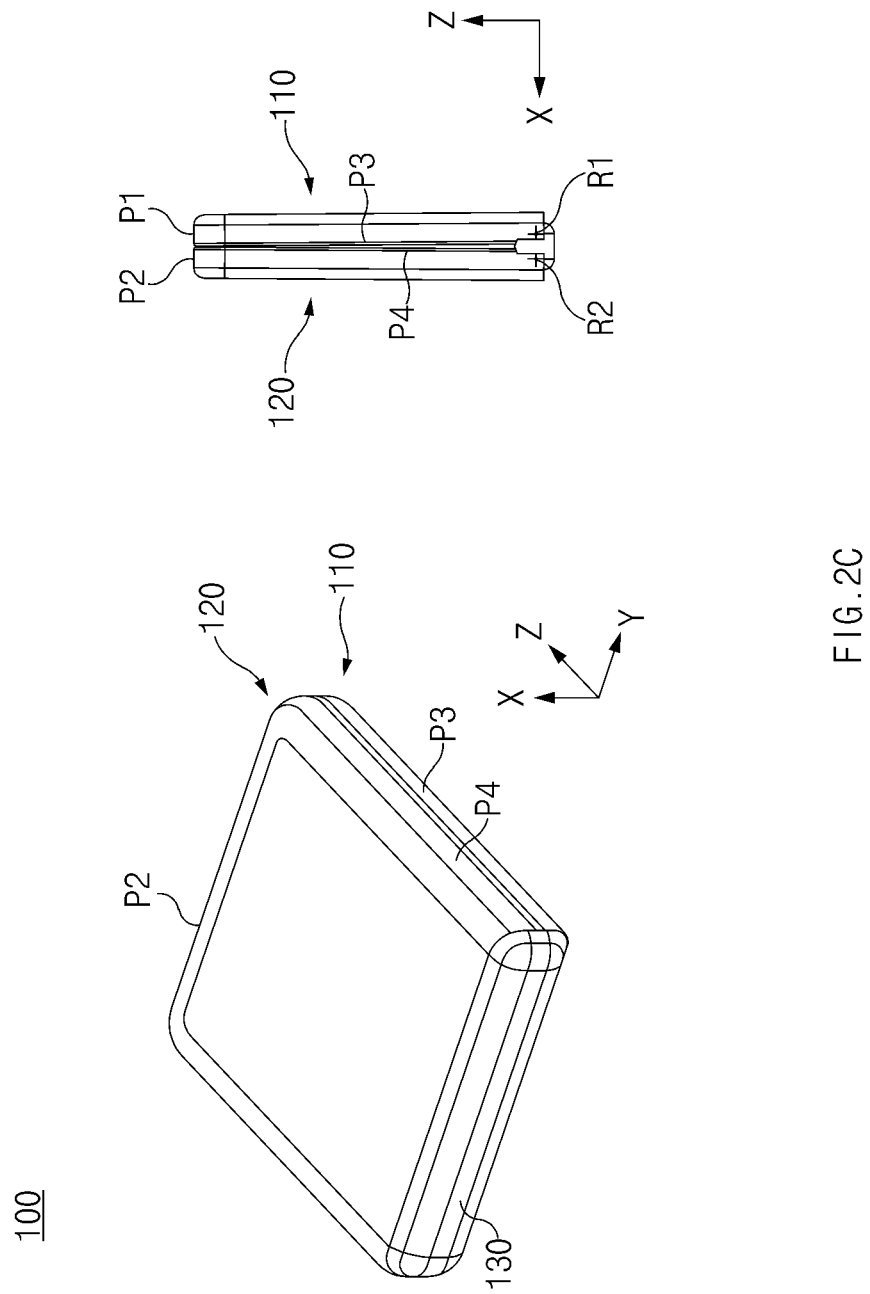
FIG. 2C illustrates a fully folded state of the electronic device according to an embodiment.

FIG. 2A is a view illustrating an unfolded state of the electronic device according to an embodiment. FIG. 2B is a view illustrating an intermediate folded state of the electronic device according to an embodiment. FIG. 2C is a view illustrating a fully folded state of the electronic device according to an embodiment.

Referring to FIGS. 2A, 2B, and 2C, the electronic device 100 according to an embodiment may be provided in a structure in which the first housing 110 and the second housing 120 are rotatable about axes of rotation R1 and R2, in opposite directions, through the hinge structure (e.g., the hinge structure 200 of FIG. 1). The electronic device 100 may execute a folding motion (e.g., a motion in which the electronic device 100 is deformed in the sequence of FIGS. 2A, 2B, and 2C) or an unfolding motion (e.g., a motion in which the electronic device 100 is deformed in the reverse sequence of FIGS. 2C, 2B, and 2A). For example, based on FIGS. 2A to 2C, in a folding motion performed in the unfolded state (the state of FIG. 2A), the first housing 110 may rotate in the counterclockwise direction, and the second housing 120 may rotate in the clockwise direction.

In an embodiment, an axial direction parallel to the axes of rotation R1 and R2 of the first housing 110 and the second housing 120 may be defined. The axial direction may be defined as the extension direction of the folding area 143 of the display 140. For example, the axial direction may be defined as the direction of long sides of the folding area 143. For example, the axial direction may refer to a direction parallel to the y-axis.

To describe states of the electronic device 100 according to certain embodiments of the disclosure, a first edge P1 of the electronic device 100 and a second edge P2 of the electronic device 100 that are parallel to the axial direction may be defined, and a third edge P3 of the electronic device 100 and a fourth edge P4 of the electronic device 100 that are perpendicular to the axial direction may be defined. For example, the first edge P1 and the third edge P3 may include a portion of the first frame (e.g., the first frame 112 of FIG. 1) of the first housing 110. For example, the second edge P2 and the fourth edge P4 may include a portion of the second frame (e.g., the second frame 122 of FIG. 1) of the second housing 120.

Hereinafter, the unfolded state of the electronic device 100 will be described with reference to FIG. 2A.

The unfolded state may refer to the state in which the folding area 143 of the display 140 is substantially flat. For example, the unfolded state may include the state in which the first area 141 and the second area 142 of the display 140 face the same direction. For example, the unfolded state may include the state in which a first normal vector n1 of the first area 141 and a second normal vector n2 of the second area 142 of the display 140 are parallel to each other. For example, the unfolded state may include the state in which the third edge P3 and the fourth edge P4 form substantially one straight line. For example, the unfolded state may include the state in which the third edge P3 and the fourth edge P4 form an angle of 180 degrees.

Hereinafter, the intermediate folded state of the electronic device 100 will be described with reference to FIG. 2B.

The intermediate folded state (or, the intermediate state) may refer to any state between the unfolded state and the fully folded state. For example, the intermediate folded state may be construed as states other than the fully folded state among a plurality of folded states. The intermediate folded state may include the state in which the folding area 143 of the display 140 is curved. For example, the intermediate folded state may include the state in which the first normal vector n1 of the first area 141 and the second normal vector n2 of the second area 142 form a certain angle rather than 180 degrees. For example, the intermediate folded state may include the state in which the third edge P3 and the fourth edge P4 form a certain angle rather than 180 degrees.

Hereinafter, the fully folded state of the electronic device 100 will be described with reference to FIG. 2C.

The fully folded state may refer to the state in which the first edge P1 and the second edge P2 substantially make contact with each other, among the plurality of folded states. For example, the curved surface formed by the folding area 143 in the fully folded state may have a greater curvature than the curved surface formed by the folding area 143 in the intermediate folded state.

According to the embodiment illustrated in FIG. 2C, in the fully folded state, the third edge P3 and the fourth edge P4 may be partially spaced apart from each other. However, the arrangement of the first housing 110 and the second housing 120 in the fully folded state is not limited to the illustrated embodiment. According to certain embodiments, the electronic device 100 may be provided in a structure in which the third edge P3 and the fourth edge P4 substantially make contact with each other in the fully folded state. For example, in the fully folded state, the third edge P3 and the fourth edge P4 may face each other in parallel.

In certain embodiments, the intermediate folded state of the electronic device 100 may be construed as including any states defined between the unfolded state and the fully folded state. For example, the intermediate folded state may include states in which the included angle between the third edge P3 and the fourth edge P4 is more than 0 degrees and less than 180 degrees.

In certain embodiments, at least a portion of the hinge housing 130 may form the exterior (or, a surface) of the electronic device 100 in the intermediate folded state and the fully folded state. For example, as illustrated in FIGS. 2B and 2C, the hinge housing 130 may be visually exposed through between the first housing 110 and the second housing 120 when the electronic device 100 is in the intermediate folded state or the fully folded state.

Figure 3:
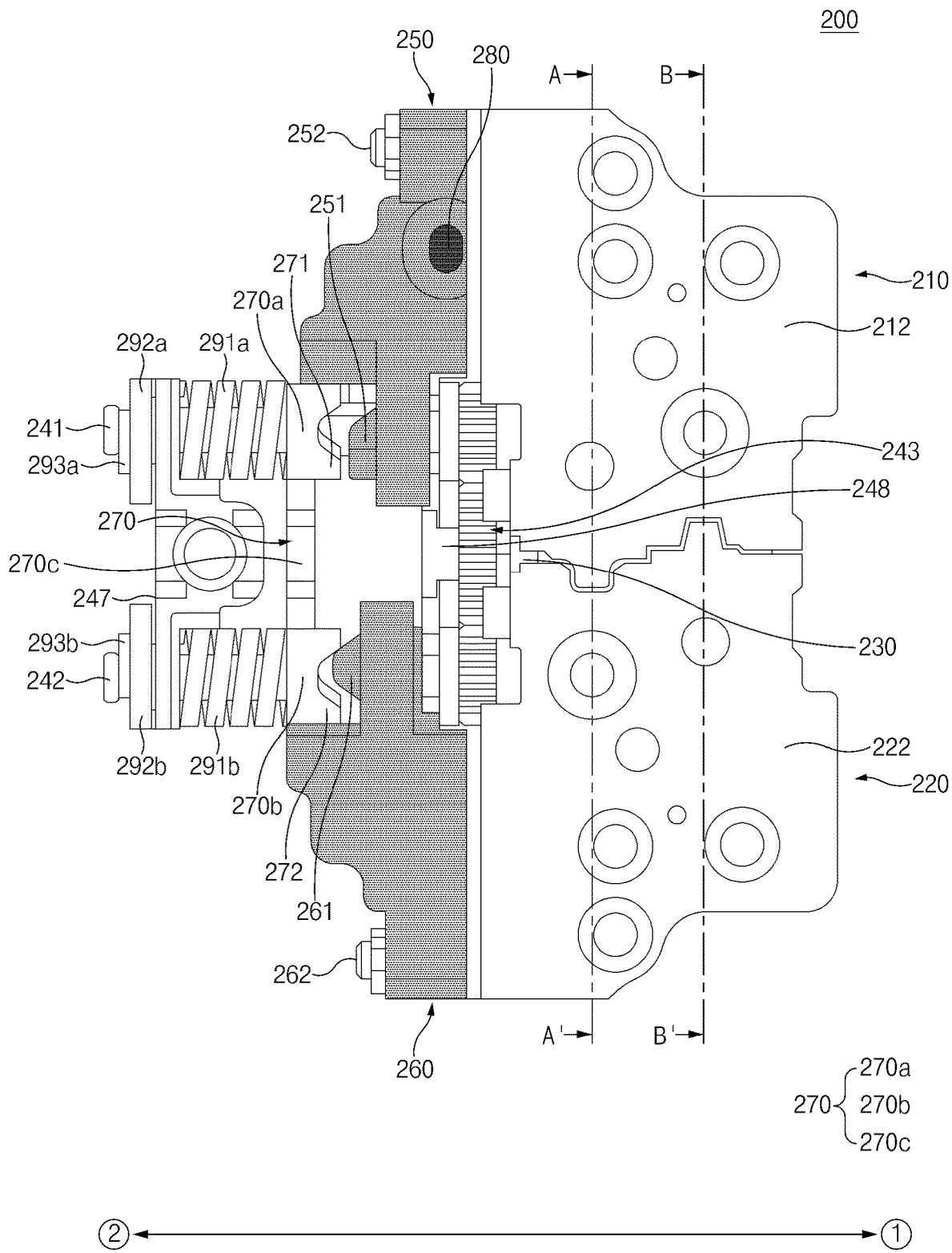
FIG. 3 illustrates a hinge structure of the electronic device according to an embodiment.
Figure 4:
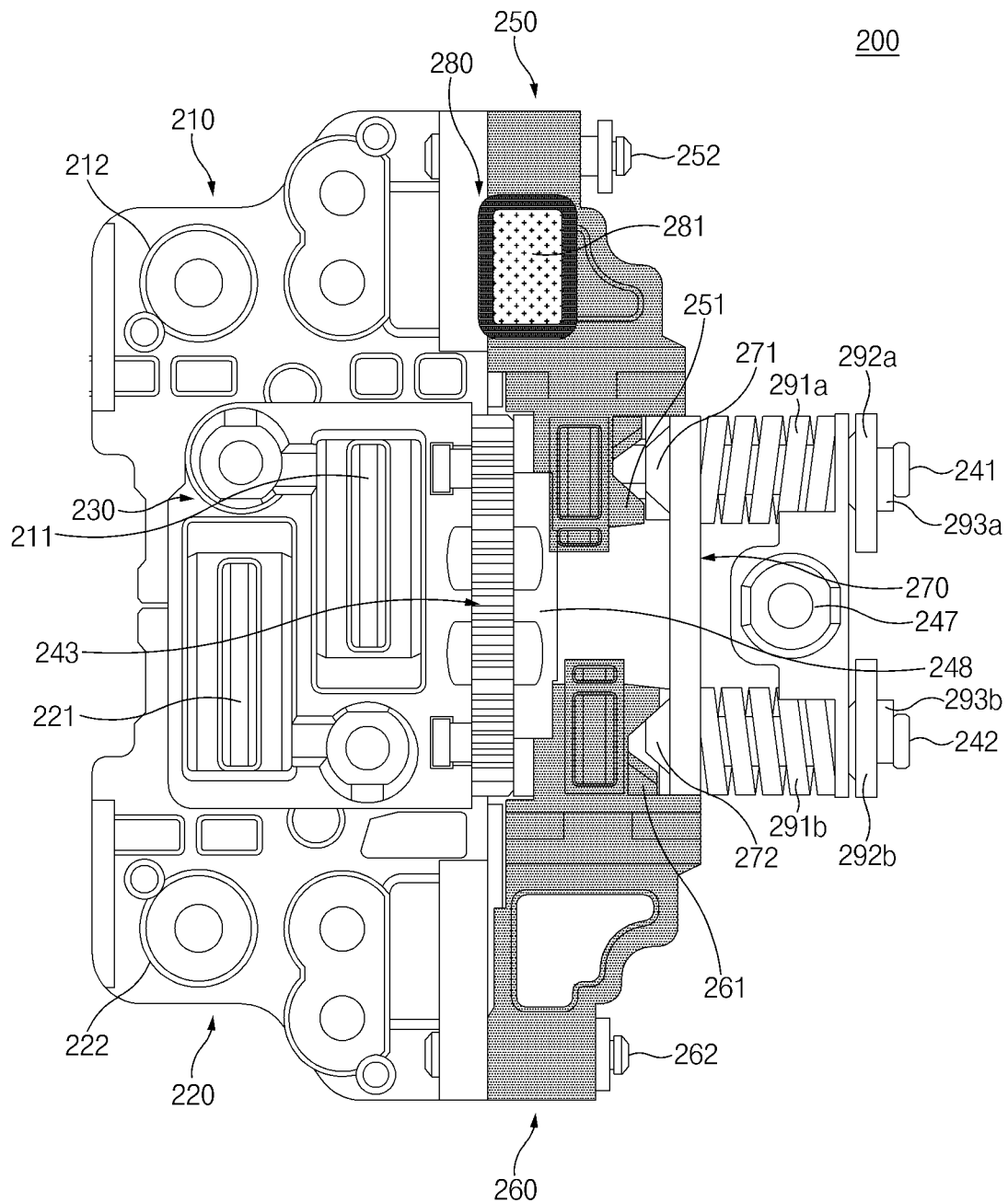
FIG. 4 illustrates the hinge structure of the electronic device according to an embodiment.
Figure 5:
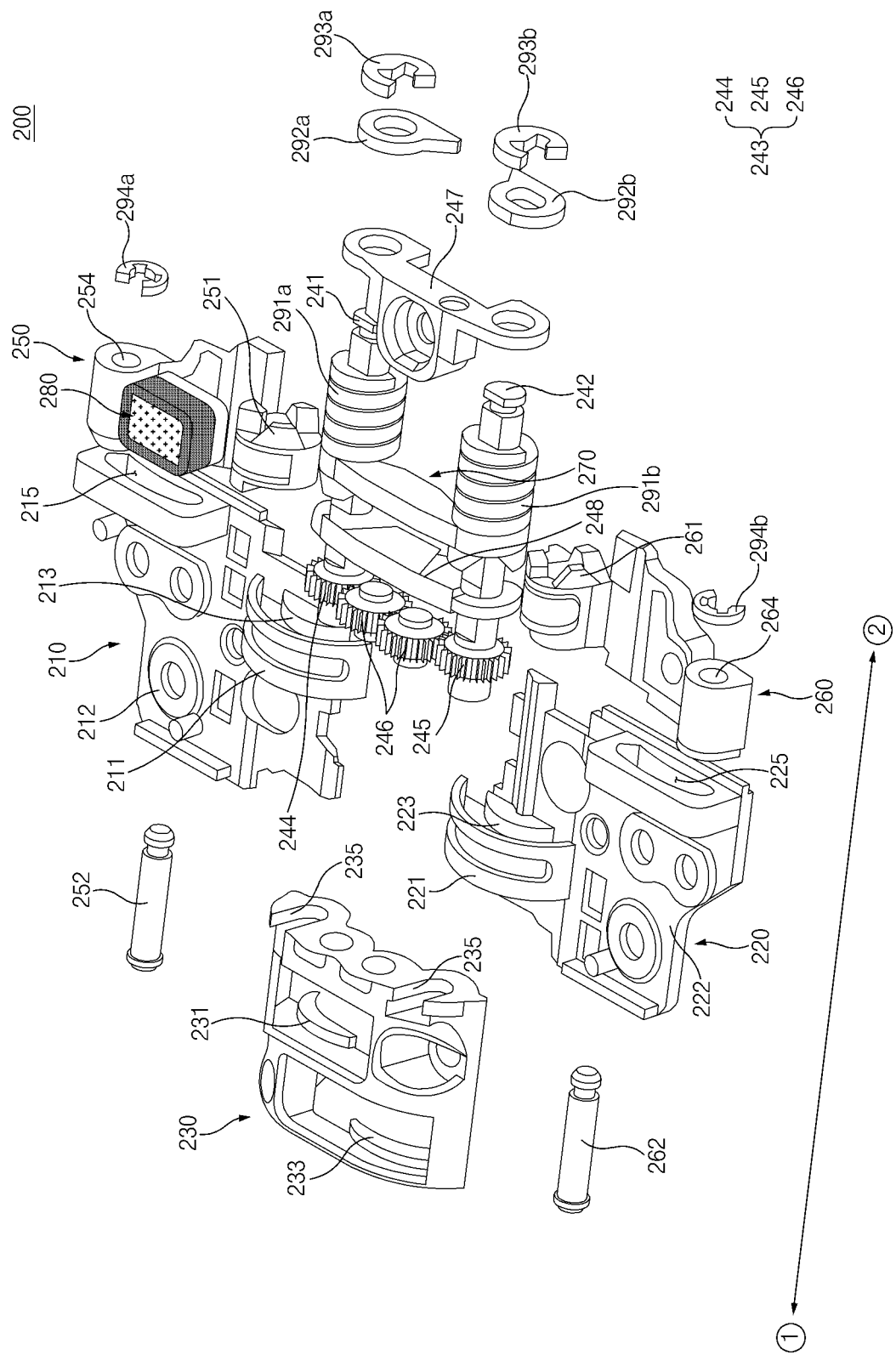
FIG. 5 is an exploded perspective view of the hinge structure of the electronic device according to an embodiment.

FIG. 3 illustrates the hinge structure of the electronic device according to an embodiment. FIG. 4 illustrates the hinge structure of the electronic device according to an embodiment. FIG. 5 is an exploded perspective view of the hinge structure of the electronic device according to an embodiment.

FIG. 3 may be a front view of the hinge structure 200. FIG. 4 may be a rear view of the hinge structure 200. FIG. 5 may be an exploded perspective view of the hinge structure 200 as viewed from the rear.

Referring to FIGS. 3 to 5, the hinge structure 200 of the electronic device (e.g., the electronic device 100 of FIGS. 1 and 2A to 2C) according to an embodiment may include the first rotary member 210, the second rotary member 220, a fixed member 230, an interlocking structure, a friction structure, and a magnet assembly 280.

As illustrated in FIGS. 3 to 5, axial directions may be defined for the hinge structure 200. The axial directions may be directions parallel to the extension direction of the first axis of rotation R1 and the second axis of rotation R2. For example, a first axial direction ① may a direction toward the fixed member 230, and a second axial direction ② may be a direction opposite to the first axial direction ① (or, a direction toward a shaft bracket 247).

In an embodiment, at least a portion of the fixed member 230 may be fixedly disposed in the hinge housing (e.g., the hinge housing 130 of FIG. 1). The first rotary member 210 and the second rotary member 220 may be coupled to portions of the fixed member 230 so as to be rotatable. A first arm shaft 241 and a second arm shaft 242 may be coupled to other portions of the fixed member 230 so as to be rotatable.

In an embodiment, the fixed member 230 may include a first guide rail 231 for guiding rotation of the first rotary member 210. For example, a first guide portion 213 of the first rotary member 210 may be accommodated in the first guide rail 231. The first guide rail 231 may form the axis of rotation (e.g., the first axis of rotation R1 of FIG. 8) or the rotational path of the first rotary member 210.

In an embodiment, the fixed member 230 may include a second guide rail 233 for guiding rotation of the second rotary member 220. For example, a second guide portion 223 of the second rotary member 220 may be accommodated in the second guide rail 233. The second guide rail 233 may form the axis of rotation (e.g., the second axis of rotation R2 of FIG. 8) or the rotational path of the second rotary member 220.

In an embodiment, the first rotary member 210 may be configured to rotate along a predetermined path relative to the fixed member 230, which is fixedly disposed in the hinge housing (e.g., the hinge housing 130 of FIG. 1), when the first housing (e.g., the first housing 110 of FIG. 1) is folded or unfolded.

In an embodiment, the first rotary member 210 may include a first coupling portion 211 coupled to the fixed member 230 so as to be rotatable and a first extending portion 212 connected to the first housing 110. The first extending portion 212 may be coupled to the first housing 110 to move together with the first housing 110. For example, the first extending portion 212 may rotate about the first axis of rotation R1 together with the first housing 110 when the electronic device 100 is folded or unfolded.

In an embodiment, the first rotary member 210 may include the first guide portion 213 formed on the first coupling portion 211. The first guide portion 213, together with the first guide rail 231, may form the rotational path of the first rotary member 210. In an embodiment, the first guide portion 213 may protrude from the first coupling portion 211 in the axial direction. For example, at least a portion of the first guide portion 213 may be accommodated in the first guide rail 231.

In an embodiment, the second rotary member 220 may be configured to rotate along a predetermined path relative to the fixed member 230, which is fixedly disposed in the hinge housing (e.g., the hinge housing 130 of FIG. 1), when the second housing (e.g., the second housing 120 of FIG. 1) is folded or unfolded.

In an embodiment, the second rotary member 220 may include a second coupling portion 221 coupled to the fixed member 230 so as to be rotatable and a second extending portion 222 connected to the second housing 120. The second extending portion 222 may be coupled to the second housing 120 to move together with the second housing 120. For example, the second extending portion 222 may rotate about the second axis of rotation R2 together with the second housing 120 when the electronic device is folded or unfolded.

In an embodiment, the second rotary member 220 may include the second guide portion 223 formed on the second coupling portion 221. The second guide portion 223, together with the second guide rail 233, may form the rotational path of the second rotary member 220. In an embodiment, the second guide portion 223 may protrude from the second coupling portion 221 in the axial direction. For example, at least a portion of the second guide portion 223 may be accommodated in the second guide rail 233.

In an embodiment, when the electronic device 100 is folded or unfolded, the interlocking structure of the hinge structure 200 may interlock the first rotary member 210 and the second rotary member 220 such that the first rotary member 210 and the second rotary member 220 rotate in opposite directions by the same angle. The interlocking structure may include the first arm shaft 241, a first arm member 250, the second arm shaft 242, a second arm member 260, a gear member 243, the shaft bracket 247, and a stopper 248.

In an embodiment, the first arm shaft 241 may be coupled to the fixed member 230 so as to be rotatable. For example, at least a portion of one end portion (e.g., an end portion facing the first axial direction ① of the first arm shaft 241 may be coupled to a portion of the fixed member 230 so as to be rotatable. For example, the end portion of the first arm shaft 241 that faces the first axial direction ① may be rotatably inserted into a recess 235 (or, an opening) formed in the fixed member 230.

For example, a first fixing ring 293a may be coupled to an end portion of the first arm shaft 241 that faces the second axial direction ②. The first fixing ring 293a may prevent separation of the first arm shaft 241 from the shaft bracket 247. A first support ring 292a may be coupled to the end portion of the first arm shaft 241 that faces the second axial direction ②. The first support ring 292a, together with the first arm shaft 241, may rotate in the same direction as the rotational direction of the first arm shaft 241, and in an unfolded state, the first support ring 292a may support a center bar (not illustrated). For example, the fixed member 230, the stopper 248, the first arm member 250, a cam member 270, a first elastic member 291a, the shaft bracket 247, the first support ring 292a, and the first fixing ring 293a may be coupled to the first arm shaft 241 in the second axial direction ②.

In an embodiment, the first arm member 250 may be coupled to the first arm shaft 241 so as to rotate about the first arm shaft 241. The first arm member 250 may be coupled to the first rotary member 210 to rotate about the first arm shaft 241 while sliding relative to the first rotary member 210 when the first rotary member 210 rotates. The first arm member 250 may include a first sliding pin 252 coupled to the first rotary member 210. For example, the first arm member 250 may be slidably coupled to the first rotary member 210 through the first sliding pin 252.

In an embodiment, the first sliding pin 252 may be inserted into a first sliding groove 215 of the first rotary member 210 and a first pin hole 254 of the first arm member 250, and may slidably connect the first arm member 250 to the first rotary member 210. A fixing ring 294a may be coupled to an end portion of the first sliding pin 252. According to an embodiment, when the first rotary member 210 rotates about the first axis of rotation R1, the first arm member 250 may rotate about the first arm shaft 241 while sliding relative to the first rotary member 210. For example, the first arm member 250 may slide in the state in which the first sliding pin 252 is accommodated in the first sliding groove 215 of the first rotary member 210.

In an embodiment, the second arm shaft 242 may be coupled to the fixed member 230 so as to be rotatable. For example, at least a portion of one end portion (e.g., an end portion facing the first axial direction ① of the second arm shaft 242 may be coupled to a portion of the fixed member 230 so as to be rotatable. For example, the end portion of the second arm shaft 242 that faces the first axial direction ① may be rotatably inserted into a recess 235 (or, an opening) formed in the fixed member 230.

For example, a second fixing ring 293b may be coupled to an end portion of the second arm shaft 242 that faces the second axial direction ②. The second fixing ring 293b may prevent separation of the second arm shaft 242 from the shaft bracket 247. A second support ring 292b may be coupled to the end portion of the second arm shaft 242 that faces the second axial direction ②. The second support ring 292b, together with the second arm shaft 242, may rotate in the same direction as the rotational direction of the second arm shaft 242, and in an unfolded state, the second support ring 292b may support a center bar (not illustrated). For example, the fixed member 230, the stopper 248, the second arm member 260, the cam member 270, a second elastic member 291b, the shaft bracket 247, the second support ring 292b, and the second fixing ring 293b may be coupled to the second arm shaft 242 in the second axial direction ②.

In an embodiment, the second arm member 260 may be coupled to the second arm shaft 242 so as to rotate about the second arm shaft 242. The second arm member 260 may be coupled to the second rotary member 220 to rotate about the second arm shaft 242 while sliding relative to the second rotary member 220 when the second rotary member 220 rotates. The second arm member 260 may include a second sliding pin 262 coupled to the second rotary member 220. For example, the second arm member 260 may be slidably coupled to the second rotary member 220 through the second sliding pin 262.

In an embodiment, the second sliding pin 262 may be inserted into a second sliding groove 225 of the second rotary member 220 and a second pin hole 264 of the second arm member 260 and may slidably connect the second arm member 260 to the second rotary member 220. A fixing ring 294b may be coupled to an end portion of the second sliding pin 262. According to an embodiment, when the second rotary member 220 rotates about the second axis of rotation R2, the second arm member 260 may rotate about the second arm shaft 242 while sliding relative to the second rotary member 220. For example, the second arm member 260 may slide in the state in which the second sliding pin 262 is accommodated in the second sliding groove 225 of the second rotary member 220.

In an embodiment, the gear member 243 may include a first gear 244 disposed on the outer circumferential surface of the first arm shaft 241, a second gear 245 disposed on the outer circumferential surface of the second arm shaft 242, and a connecting gear 246 connecting the first gear 244 and the second gear 245 for interlocking of the first gear 244 and the second gear 245. The gear member 243 may allow the first arm shaft 241 and the second arm shaft 242 to operate in conjunction with each other, and rotate in opposite directions by a same angle. For example, when one of the first arm shaft 241 and the second arm shaft 242 rotates in a first direction (e.g., the clockwise direction) by a first angle, the gear member 243 may rotate the other one of the first arm shaft 241 and the second arm shaft 242 in the direction (e.g., the counterclockwise direction) opposite to the first direction by the same first angle. For example, the connecting gear 246 may include an even number of gears to allow the first arm shaft 241 and the second arm shaft 242 to operate in conjunction with each other and rotate in the opposite directions.

In an embodiment, the shaft bracket 247 may be fixedly disposed in the hinge housing 130. The shaft bracket 247 may be disposed on the end portions of the first arm shaft 241 and the second arm shaft 242 that face the second axial direction ②. The shaft bracket 247 may be configured to support rotation of the first arm shaft 241 and the second arm shaft 242 together with the fixed member 230. For example, the opposite end portions of each of the first arm shaft 241 and the second arm shaft 242 may be supported by the shaft bracket 247 and the fixed member 230 (e.g., the recess 235).

In an embodiment, the shaft bracket 247 may support an end portion of the first elastic member 291a, and an end portion of the second elastic member 291b that faces the second axial direction ②. For example, as the end portions of the first elastic member 291a and the second elastic member 291b facing the second axial direction ② are supported by the shaft bracket 247, the first elastic member 291a and the second elastic member 291b may be compressed when pressed in the second axial direction ②. In an embodiment, the shaft bracket 247 may have, in at least some portions thereof, through-holes (not illustrated) into which the first arm shaft 241 and the second arm shaft 242 are inserted.

In an embodiment, the stopper 248 may be fixedly disposed in the hinge housing 130. The stopper 248 may limit the range of rotation of the first arm member 250 and the second arm member 260. For example, at least a portion of the stopper 248 may be located between the first arm member 250 and the second arm member 260. In an embodiment, the stopper 248 may have, in at least portions thereof, through-holes (not illustrated) into which the first arm shaft 241 and the second arm shaft 242 are inserted.

In an embodiment, a friction structure of the hinge structure 200 may be configured to provide torque corresponding to a restoring force of the display (e.g., the display 140 of FIGS. 2A to 2C). For example, in an intermediate folded state (e.g., FIG. 2B) or a fully folded state (e.g., FIG. 2C) in which a partial area of the display 140 is curved, the restoring force of the display 140 may act on the first rotary member 210 and the second rotary member 220. For example, the restoring force of the display 140 may refer to a force by which the curved portion returns to a flat state. The friction structure may be configured to provide a frictional torque capable of cancelling out the restoring force.

In an embodiment, the friction structure may include a first cam 251, a second cam 261, the cam member 270, the first elastic member 291a, and the second elastic member 291b. The friction structure according to an embodiment may be configured such that some of the structures coupled to the first arm shaft 241 and the second arm shaft 242 rotate together with the arm shafts 241 and 242 or linearly move in the axial directions along the arm shaft 241 and 242 and the other structures are fixed to the arm shafts 241 and 242, to provide frictional torque.

For example, when the first arm shaft 241 rotates, the first arm member 250 may rotate together with the first arm shaft 241 and without linear motion in the axial directions. When the second arm shaft 242 rotates, the second arm member 260 may rotate together with the second arm shaft 242 and without linear motion in the axial directions. For example, the first arm member 250 and the second arm member 260 may rotate in the state in which the axial positions thereof on the first arm shaft 241 and the second arm shaft 242 are fixed.

For example, when the first arm shaft 241 and the second arm shaft 242 rotate, the cam member 270 may not rotate together with the first arm shaft 241 and the second arm shaft 242 and may linearly move in the axial directions along the first arm shaft 241 and the second arm shaft 242. For example, when the first arm shaft 241 rotates, the first elastic member 291a may be compressed or uncompressed in the axial directions by the axial movement of the cam member 270. When the second arm shaft 242 rotates, the second elastic member 291b may be compressed or uncompressed by the axial movement of the cam member 270.

For example, when the first arm shaft 241 rotates, the first fixing ring 293a may not move in the axial directions and may or may not rotate together with the first arm shaft 241. When the second arm shaft 242 rotates, the second fixing ring 293b may not move in the axial directions and may or may not rotate together with the second arm shaft 242. For example, when the first arm shaft 241 rotates, the first support ring 292a may not move in the axial directions and may rotate together with the first arm shaft 241. When the second arm shaft 242 rotates, the second support ring 292b may not move in the axial directions and may rotate together with the second arm shaft 242.

In an embodiment, the first cam 251 may be formed on the first arm member 250. For example, the first cam 251 may be formed on the first arm member 250 to surround the outer circumferential surface of the first arm shaft 241 passing through the first arm member 250. The first cam 251 may be engaged with a third cam 271 of the cam member 270. When the first arm shaft 241 rotates, the first cam 251 may not move in the axial directions and may rotate together with the first arm shaft 241. For example, the first cam 251 may rotate relative to the third cam 271 by rotation of the first arm shaft 241.

In an embodiment, the second cam 261 may be formed on the second arm member 260. For example, the second cam 261 may be formed on the second arm member 260 so as to surround the outer circumferential surface of the second arm shaft 242 passing through the second arm member 260. The second cam 261 may be engaged with a fourth cam 272 of the cam member 270. When the second arm shaft 242 rotates, the second cam 261 may not move in the axial directions and may rotate together with the second arm shaft 242. For example, the second cam 261 may rotate relative to the fourth cam 272 by rotation of the second arm shaft 242.

In an embodiment, the cam member 270 may be configured such that the first arm shaft 241 and the second arm shaft 242 pass through at least portions of the cam member 270. When the first arm shaft 241 and the second arm shaft 242 rotate, the cam member 270 may not rotate together with the arm shafts 241 and 242 and may move in the axial directions.

In an embodiment, the cam member 270 may include a first portion 270a through which the first arm shaft 241 passes, a second portion 270b through which the second arm shaft 242 passes, and a connecting portion 270c connecting the first portion 270a and the second portion 270b. The third cam 271 may be engaged with the first cam 251 of the first arm member 250, and may be formed on the first portion 270a. The fourth cam 272, as engaged with the second cam 261 of the second arm member 260, may be formed on the second portion 270b. For example, the third cam 271 may be formed on the first portion 270a to surround the first arm shaft 241, and the fourth cam 272 may be formed on the second portion 270b to surround the second arm shaft 242.

In an embodiment, the cam member 270 may compress the first elastic member 291a and the second elastic member 291b while moving in the second axial direction ② by rotation of the first cam 251 and the second cam 261, or may be pressed in the first axial direction ① by the elastic forces of the first elastic member 291a and the second elastic member 291b. For example, when the first cam 251 and the second cam 261 rotate relative to the third cam 271 and the fourth cam 272 in the state in which protrusions of the first cam 251 and the second cam 261 are located in depressions of the third cam 271 and the fourth cam 272, the protrusions of the first cam 251 and the protrusions of the second cam 261 may contact with protrusions of the third cam 271 and protrusions of the fourth cam 272, respectively, to move the cam member 270 in the second axial direction ②.

In an embodiment, the first elastic member 291a may be disposed between the cam member 270 and the shaft bracket 247. The first elastic member 291a may be coupled to the first arm shaft 241. For example, a portion of the first arm shaft 241 may be inserted into the first elastic member 291a. The first elastic member 291a may include a coil spring that may be axially compressed or uncompressed.

In an embodiment, the first elastic member 291a may be compressed or uncompressed in response to rotation of the first arm member 250. For example, the first elastic member 291a may be compressed when the cam member 270 moves in the second axial direction ②, and the compressed first elastic member 291a may press the cam member 270 in the first axial direction L. According to an embodiment, an elastic force may be applied to the cam member 270 in the first axial direction ① by the compressed first elastic member 291a, and thus a frictional force between the first cam 251 of the first arm member 250 and the third cam 271 of the cam member 270 may be increased.

In an embodiment, the second elastic member 291b may be disposed between the cam member 270 and the shaft bracket 247. The second elastic member 291b may be coupled to the second arm shaft 242. For example, a portion of the second arm shaft 242 may be inserted into the second elastic member 291b. The second elastic member 291b may include a coil spring that can be axially compressed or uncompressed.

In an embodiment, the second elastic member 291b may be compressed or uncompressed in response to rotation of the second arm member 260. For example, the second elastic member 291b may be compressed when the cam member 270 moves in the second axial direction ②, and the compressed second elastic member 291b may press the cam member 270 in the first axial direction ①. According to an embodiment, an elastic force may be applied to the cam member 270 in the first axial direction ① by the compressed second elastic member 291b, and thus a frictional force between the second cam 261 of the second arm member 260 and the fourth cam 272 of the cam member 270 may be increased.

In an embodiment, the magnet assembly 280 may be configured to interact with another component (e.g., a sensor module 160 of FIGS. 12 to 15) of the electronic device 100, and provide information by which the processor of the electronic device 100 (e.g., a processor 320 of FIG. 17) may determine a state of the electronic device 100. For example, the magnet assembly 280 may include a magnet 281, and the processor 320 may determine a state of the electronic device 100, based on the distance between the sensor module 160 and the magnet 281. An arrangement structure of the sensor module 160 and a change in the distance between the sensor module 160 and the magnet 281 depending on states of the electronic device 100 will be described below in more detail with reference to FIGS. 10 to 16.

In an embodiment, the magnet assembly 280 may be disposed on the arm members 250 and 260. For example, the magnet assembly 280 may be coupled to at least one of the first arm member 250 or the second arm member 260. According to the embodiment illustrated in FIGS. 3 to 5, the magnet assembly 280 may be coupled to the first arm member 250. The magnet assembly 280 may be coupled to the first arm member 250 such that the magnet 281 is exposed in the rear direction of the hinge structure 200 (e.g., the −z-axis direction of FIG. 1). For example, referring to FIG. 1, the magnet assembly 280 may be coupled to the first arm member 250 such that the magnet 281 is located in a direction toward the hinge housing 130 or the first plate 111. The magnet assembly 280 may rotate together with the first arm member 250 when the electronic device 100 is folded or unfolded. Hereinafter, FIGS. 6 to 16 will be described, including the structure in which the magnet assembly 280 is disposed on the first arm member 250. However, embodiments of the disclosure are not limited thereto. For example, the magnet assembly 280 may be coupled to the second arm member 260, or may be coupled to each of the first arm member 250 and the second arm member 260. An arrangement structure of the magnet assembly 280 will be described below in more detail with reference to FIGS. 6 and 7.

Figure 6:
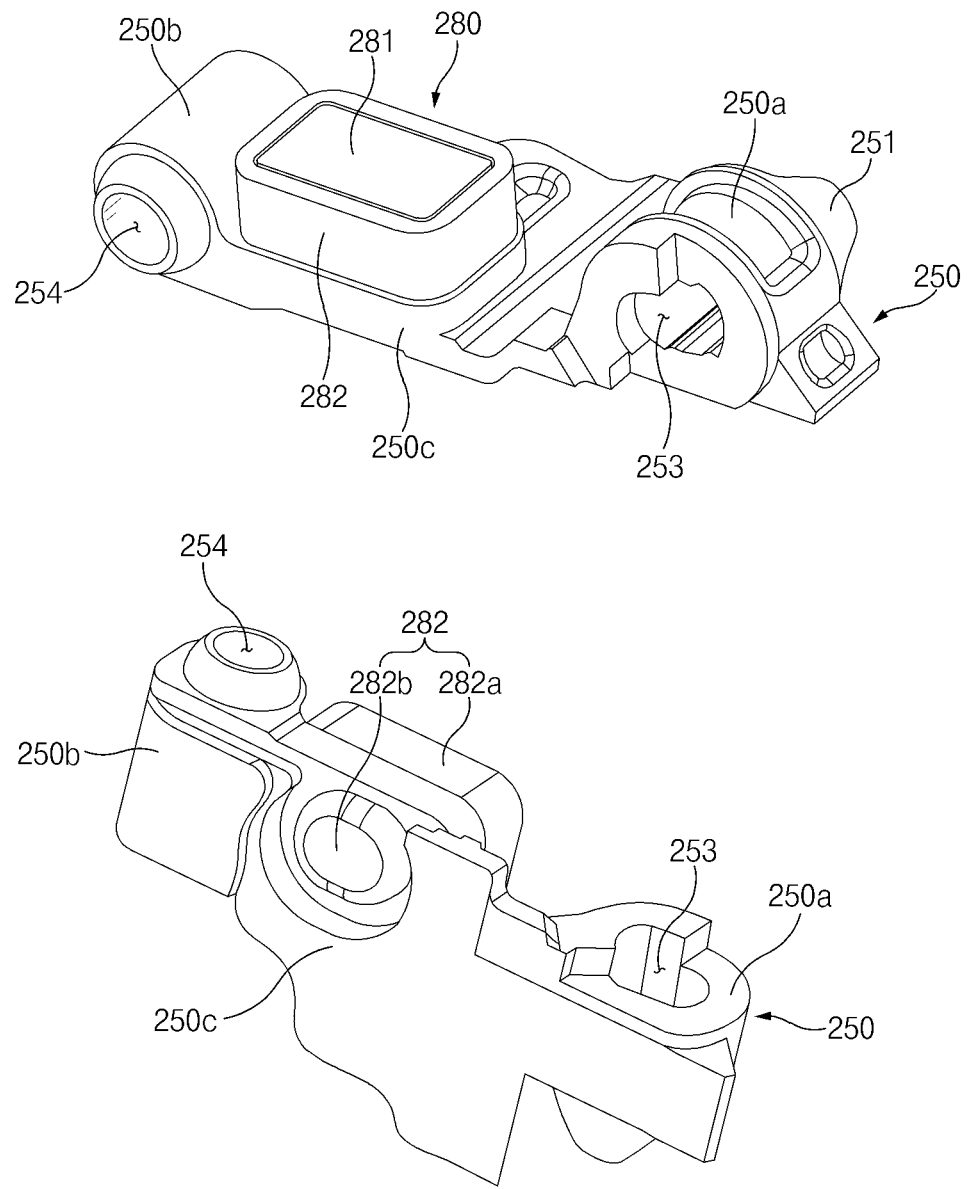
FIG. 6 illustrates a first arm member and a magnet assembly of the hinge structure according to an embodiment.
Figure 7:
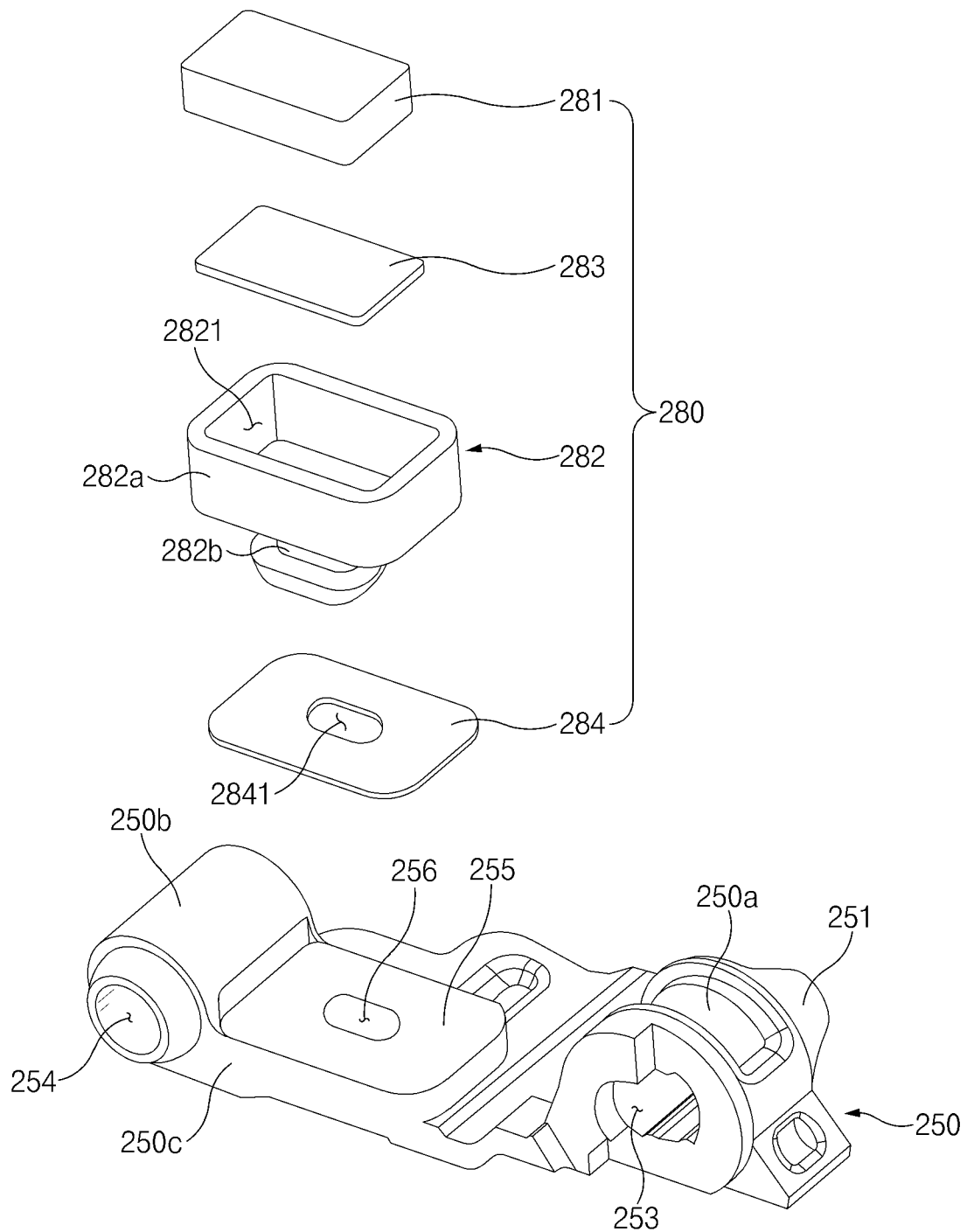
FIG. 7 illustrates the first arm member and the magnet assembly of the hinge structure according to an embodiment.

FIG. 6 illustrates the first arm member and the magnet assembly of the hinge structure according to an embodiment. FIG. 7 illustrates the first arm member and the magnet assembly of the hinge structure according to an embodiment.

FIG. 6 is a view illustrating a state in which the magnet assembly 280 is coupled with the first arm member 250. FIG. 7 is a view illustrating a state in which the magnet assembly 280 is separated from the first arm member 250 and a state in which the magnet assembly 280 is disassembled.

Referring to FIGS. 6 and 7, the hinge structure 200 according to an embodiment may include the first arm member 250 and the magnet assembly 280 coupled to the first arm member 250. FIGS. 6 and 7 illustrate an embodiment in which the magnet assembly 280 is coupled to the first arm member 250. However, as described above, the position of the magnet assembly 280 is not limited thereto.

In an embodiment, the first arm member 250 may include a first coupling portion 250a having the first cam 251 formed thereon, a second coupling portion 250b having the first pin hole 254 formed therein, and a third coupling portion 250c connecting the first coupling portion 250a and the second coupling portion 250b.

In an embodiment, the first coupling portion 250a may be coupled to the first arm shaft 241. For example, the first coupling portion 250a may have a through-hole 253 formed therein into which the first arm shaft 241 is inserted. In an embodiment, the first cam 251 may be formed on the first coupling portion 250a. For example, the first cam 251 may be formed along the periphery of the through-hole 253. The first arm member 250 may be formed such that the first cam 251 surrounds the first arm shaft 241 when the first arm shaft 241 is inserted into the through-hole 253.

In an embodiment, the second coupling portion 250b may be slidably coupled to the first rotary member 210. For example, the second coupling portion 250b may have the first pin hole 254 formed therein into which the first sliding pin 252 is inserted. Referring to FIGS. 3 to 5, the first sliding pin 252 may pass through the first pin hole 254 of the second coupling portion 250b and the first sliding groove 215 of the first rotary member 210.

In an embodiment, the third coupling portion 250c may be located between the first coupling portion 250a and the second coupling portion 250b. For example, the third coupling portion 250c may extend from the first coupling portion 250a toward the second coupling portion 250b. The magnet assembly 280 may be coupled to the third coupling portion 250c. For example, the third coupling portion 250c may have a seating portion 255 on which the magnet assembly 280 is seated. For example, the seating portion 255 of the third coupling portion 250c may have a coupling hole 256 formed therein into which at least a portion of the magnet assembly 280 is inserted.

In an embodiment, the magnet assembly 280 may be coupled to the third coupling portion 250c of the first arm member 250. For example, the magnet assembly 280 may be fixedly disposed on the third coupling portion 250c. The magnet assembly 280 may include a magnet bracket 282, the magnet 281, a first adhesive member 284, and a second adhesive member 283.

In an embodiment, the magnet bracket 282 may be coupled to the first arm member 250. For example, the magnet bracket 282 may be coupled to the seating portion 255 of the third coupling portion 250c. The magnet assembly 282 may include a receiving portion 282a in which at least a portion of the magnet 281 is accommodated and a protruding portion 282b protruding from the receiving portion 282a.

In an embodiment, at least a portion of the magnet 281 may be disposed in the receiving portion 282a. For example, the receiving portion 282a may include a receiving space 2821 formed therein in which the magnet 281 is accommodated. The receiving space 2821 may be formed in a size and/or shape substantially corresponding to a size or shape of the magnet 281. The receiving portion 282a may be seated on the seating portion 255 of the third coupling portion 250c. For example, the receiving portion 282a may be attached to the seating portion 255 through the first adhesive member 284. In certain embodiments, the first adhesive member 284 may include a double-sided tape or an adhesive.

In an embodiment, the protruding portion 282b may protrude from the bottom surface of the receiving portion 282a toward the first arm member 250. The protruding portion 282b may be inserted into the coupling hole 256 of the third coupling portion 250c and may pass through the seating portion 255. For example, the protruding portion 282b may be fused to the third coupling portion 250c. According to an embodiment, the magnet bracket 282 may be coupled to the first arm member 250 such that the receiving portion 282a is seated on the seating portion 255 and the protruding portion 282b passes through the coupling hole 256. The first adhesive member 284 may have an opening 2841 through which the protruding portion 282b passes and that is aligned with the coupling hole 256.

In an embodiment, the magnet bracket 282 may be formed of a non-metallic material to prevent the first arm member 250 from having magnetism by making contact with the magnet 281. For example, in the case where the first arm member 250 is formed of a metallic material, the first arm member 250 (or, the hinge structure 200) may be magnetized when the magnet 281 makes contact with the first arm member 250. According to an embodiment, as the magnet bracket 282 is formed of a non-metallic material, magnetization of the first arm member 250 (or, the hinge structure 200) by the magnet 281 may be decreased. However, the material of the first arm member 250 and/or the material of the magnet bracket 282 are not limited to the above-described contents.

In an embodiment, the magnet 281 may be fixedly disposed in the receiving portion 282a. For example, the magnet 281 may be attached to the receiving space 2821 through the second adhesive member 283. The magnet 281 may be accommodated in the receiving portion 282a such that one surface of the magnet 281 is exposed outside the magnet bracket 282. For example, an opposite surface facing away from the one surface may be attached to the bottom surface in the receiving space 2821 through the second adhesive member 283. According to an embodiment, the magnet assembly 280 may be coupled to the third coupling portion 250c such that the one surface of the magnet 281 faces the rear direction of the hinge structure 200 (e.g., the −z-axis direction of FIG. 1) or faces toward the first plate (e.g., the first plate 111 of FIG. 1) of the first housing (e.g., the first housing 110 of FIG. 1).

Although not illustrated, the magnet assembly 280 may further include a shielding member (not illustrated). The shielding member may be disposed in the receiving portion 282a. For example, the shielding member may be located between the bottom surface in the receiving space 2821 and the magnet 281, or may be located between the second adhesive member 283 and the magnet 281. In certain embodiments, the shielding member may at least partially shield the magnetic force of the magnet 281 to reduce incidence of the magnetic force of the magnet 281 on the first arm member 250, and allow the magnetic force of the magnet 281 to propagate towards the opposite side and the first arm member 250 (e.g., in an upper direction based on FIG. 7).

According to certain embodiments, the magnet assembly 280 may be coupled to the second arm member 260. In a case where the magnet assembly 280 is coupled to the second arm member 260, the structure and/or the components of the first arm member 250 described with reference to FIGS. 6 and 7 may be identically applied to the second arm member 260.

Figure 8:
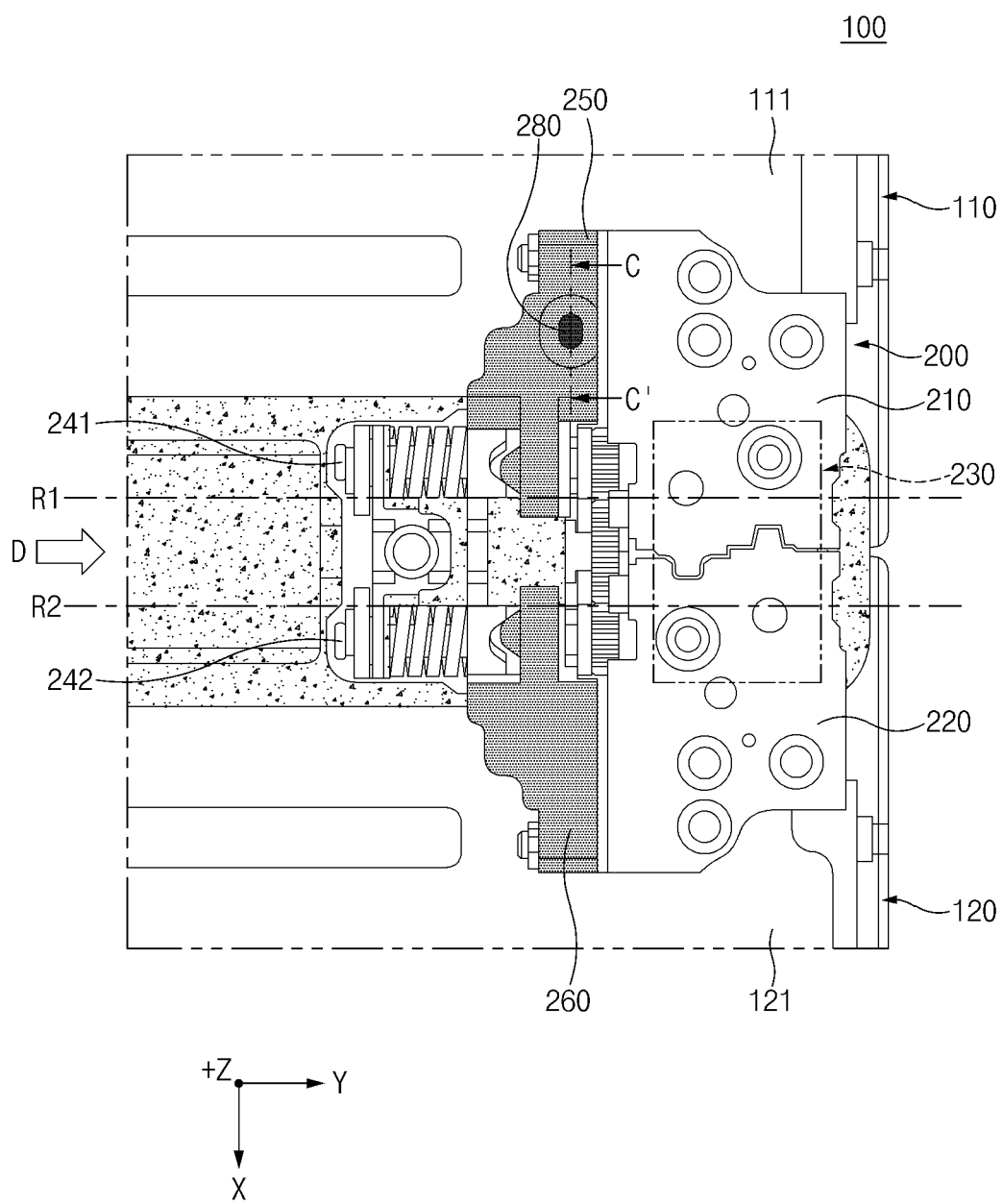
FIG. 8 illustrates housings and the hinge structure of the electronic device according to an embodiment.

FIG. 8 illustrates the housings and the hinge structure of the electronic device according to an embodiment.

FIG. 8 is a view in which the display (e.g., the display 140 of FIG. 1) is omitted from illustration, to illustrate a coupling structure between the housings 110 and 120 and the hinge structure 200. For example, FIG. 8 is a view illustrating the hinge structure 200 and the housings 110 and 120 when the electronic device 100 is in an unfolded state.

Referring to FIG. 8, the electronic device 100 according to an embodiment may include the first housing 110, the second housing 120, the hinge housing 130, and the hinge structure 200. The hinge housing 130 may be located between the first housing 110 and the second housing 120. The hinge structure 200 may rotatably connect the first housing 110 and the second housing 120.

In an embodiment, the hinge structure 200 may include the fixed member 230, the first rotary member 210, the second rotary member 220, the first arm member 250, the second arm member 260, the first arm shaft 241, the second arm shaft 242, and the magnet assembly 280. For example, the components of the hinge structure 200 illustrated in FIG. 8 may be identical or similar to some of the components of the hinge structure 200 illustrated in FIGS. 3 to 5, and repetitive descriptions will hereinafter be omitted.

In an embodiment, the fixed member 230 may be fixed between the first housing 110 and the second housing 120. For example, the fixed member 230 may be fixedly disposed in the hinge housing 130. The first rotary member 210 and the second rotary member 220 may be coupled to the fixed member 230 so as to be rotatable. The fixed member 230 may be located between the rotary members 210 and 220 and the hinge housing 130. For example, as illustrated in FIG. 8, in an unfolded state of the electronic device 100, the fixed member 230 may be located under the first rotary member 210 and the second rotary member 220 (e.g., in the −z-axis direction), and may be partially hidden by the first rotary member 210 and the second rotary member 220.

In an embodiment, the first rotary member 210 may be coupled to the fixed member 230 so as to be rotatable about the first axis of rotation R1. The first rotary member 210 may be connected or coupled to the first plate 111 to rotate together with the first housing 110. For example, the first rotary member 210 may be screw-coupled with the first plate 111, and a plurality of fastening holes for the screw coupling may be formed in the first rotary member 210. When the electronic device 100 is folded or unfolded, the first rotary member 210 may rotate about the first axis of rotation R1 together with the first housing 110.

In an embodiment, the second rotary member 220 may be coupled to the fixed member 230 so as to be rotatable about the second axis of rotation R2. The second rotary member 220 may be connected or coupled to the second plate 121, to rotate together with the second housing 120. For example, the second rotary member 220 may be screw-coupled with the second plate 121, and a plurality of fastening holes for the screw coupling may be formed in the second rotary member 220. When the electronic device 100 is folded or unfolded, the second rotary member 220 may rotate about the second axis of rotation R2 together with the second housing 120. Rotation of the rotary members 210 and 220 relative to the fixed member 230 will be described below in more detail with reference to FIG. 9.

In an embodiment, the first axis of rotation R1 of the first rotary member 210 and the second axis of rotation R2 of the second rotary member 220 may be parallel to each other. The first axis of rotation R1 and the second axis of rotation R2 may be substantially parallel to the arm shafts 241 and 242. As illustrated in FIG. 8, the first axis of rotation R1 and the second axis of rotation R2 may be located between the first arm shaft 241 and the second arm shaft 242 when the plates 111 and 121 of the electronic device 100 are viewed from above (e.g., in the +z-axis direction).

In an embodiment, the first arm member 250 may rotate together with the first arm shaft 241, and the first arm shaft 241 may be coupled to the fixed member 230 so as to be rotatable. For example, the center of rotation of the first arm member 250 may coincide with the first arm shaft 241. The first arm member 250 may connect the first rotary member 210 and the first arm shaft 241 such that the first rotary member 210 and the first arm shaft 241 rotate in conjunction with each other. According to an embodiment, the first rotary member 210 and the first arm member 250 may rotate about the first axis of rotation R1 and the first arm shaft 241, respectively, and therefore the rotational paths thereof may be formed to be different from each other.

In an embodiment, the second arm member 260 may rotate together with the second arm shaft 242, and the second arm shaft 242 may be coupled to the fixed member 230 so as to be rotatable. For example, the center of rotation of the second arm member 260 may coincide with the second arm shaft 242. The second arm member 260 may connect the second rotary member 220 and the second arm shaft 242, such that the second rotary member 220 and the second arm shaft 242 rotate in conjunction with each other. According to an embodiment, the second rotary member 220 and the second arm member 260 may rotate about the second axis of rotation R2 and the second arm shaft 242, respectively, and therefore, the rotational paths thereof may be formed so as to be different from each other. Rotary motions of the rotary members 210 and 220 and the arm members 250 and 260 will be described below in more detail with reference to FIGS. 10 and 11.

In an embodiment, the magnet assembly 280 may be coupled to the first arm member 250 such that the protruding portion 282b of the magnet bracket (e.g., the magnet bracket 282 of FIGS. 6 and 7) is visible when the plates 111 and 121 of the electronic device 100 are viewed from above. Referring to FIGS. 6 and 7 together, the magnet assembly 280 may be disposed such that the one surface of the magnet (e.g., the magnet 281 of FIGS. 6 and 7) faces the first plate 111. Although not illustrated, a sensor module (e.g., the sensor module 160 of FIGS. 11 to 16) that is at least partially aligned with the magnet 281 may be disposed on the first plate 111 of the first housing 110. An arrangement structure of the magnet 281 and the sensor module 160 will be described below in more detail with reference to FIG. 15.

Figure 9:
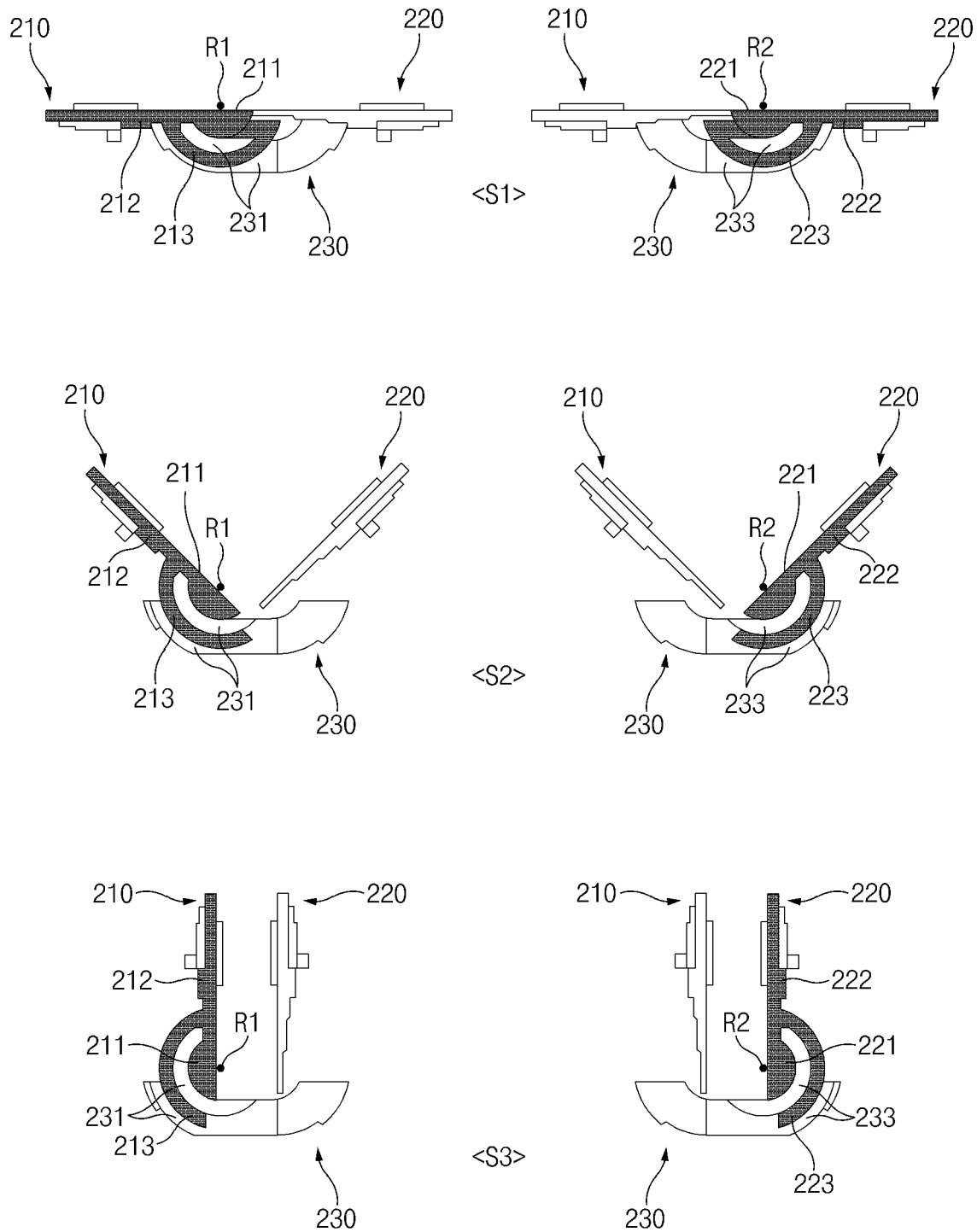
FIG. 9 illustrates rotary motions of rotary members of the hinge structure according to an embodiment.

FIG. 9 illustrates rotary motions of the rotary members of the hinge structure according to an embodiment.

FIG. 9 is a view illustrating sections of the hinge structure 200 taken along lines A-A' and B-B' in FIG. 3.

<S1> of FIG. 9 is a view illustrating the hinge structure 200 in an unfolded state, <S2> of FIG. 9 is a view illustrating the hinge structure 200 in an intermediate folded state, and <S3> of FIG. 9 is a view illustrating the hinge structure 200 in a fully folded state.

Referring to FIG. 9, the hinge structure 200 according to an embodiment may include the fixed member 230, the first rotary member 210 coupled to the fixed member 230 so as to be rotatable about the first axis of rotation R1, and the second rotary member 220 coupled to the fixed member 230 so as to be rotatable about the second axis of rotation R2.

In an embodiment, the first guide rail 231 and the second guide rail 233 may be formed on the fixed member 230. In an embodiment, the first guide rail 231 may include a substantially arc shape. For example, the center of the arc of the first guide rail 231 may coincide with the first axis of rotation R1. For example, the first guide rail 231 may physically guide rotation of the first rotary member 210 along a rotational path whose center coincides with the first axis of rotation R1. In an embodiment, the second guide rail 233 may have a substantially arc shape. For example, the center of the arc of the second guide rail 233 may coincide with the second axis of rotation R2. For example, the second guide rail 233 may guide rotation of the second rotary member 220 along a rotational path whose center coincides with the second axis of rotation R2.

In an embodiment, the first rotary member 210 may include the first extending portion 212 and the first coupling portion 211. The first coupling portion 211 may have a substantially cylindrical shape. For example, the cross-section of the first coupling portion 211 may have a substantially arc shape. In an embodiment, the first rotary member 210 may rotate about the first axis of rotation R1 in the state in which the first guide portion 213 of the first coupling portion 211 is accommodated in the first guide rail 231 of the fixed member 230. For example, when the first extending portion 212 is folded or unfolded together with the first housing 110, the first rotary member 210 may rotate along a rotational path having an arc shape whose center coincides with the first axis of rotation R1.

In an embodiment, the second rotary member 220 may include the second extending portion 222 and the second coupling portion 221. The second coupling portion 221 may have a substantially cylindrical shape. For example, the cross-section of the second coupling portion 221 may have a substantially arc shape. In an embodiment, the second rotary member 220 may rotate about the second axis of rotation R2 in the state in which the second guide portion 223 is accommodated in the second guide rail 233. For example, when the second extending portion 222 is folded or unfolded together with the second housing 120, the second rotary member 220 may rotate along a rotational path having an arc shape whose center coincides with the second axis of rotation R2.

In an embodiment, the first axis of rotation R1 and the second axis of rotation R2 may be parallel to the axial directions of the hinge structure 200. In an embodiment, the first axis of rotation R1 and the second axis of rotation R2 may be formed in positions spaced apart from the first extending portion 212 of the first rotary member 210 and the second extending portion 222 of the second rotary member 220 in the z-axis direction (e.g., the z-axis direction of FIGS. 1 to 2C).

Referring to <S1> of FIG. 9, in the unfolded state, the first extending portion 212 may limit a rotational direction of the first rotary member 210 to one direction. For example, a first end portion of the first guide rail 231 may be open, and a second end portion of the first guide rail 231 may be covered by the first extending portion 212. Accordingly, the first rotary member 210 is rotatable about the first axis of rotation R1 in the clockwise direction with respect to the drawing in a folding motion and is not rotatable in the counterclockwise direction in an unfolding motion.

Referring to <S1> of FIG. 9, in the unfolded state, the second extending portion 222 may limit a rotational direction of the second rotary member 220 towards one direction. For example, a third end portion of the second guide rail 233 may be open, and a fourth end portion of the second guide rail 233 may be covered by the second extending portion 222. Accordingly, the second rotary member 220 is rotatable about the second axis of rotation R2 in the counterclockwise direction with respect to the drawing in a folding motion, and is not rotatable in the clockwise direction in an unfolding motion.

An intermediate folded state of the hinge structure 200 is not limited to <S2> illustrated in FIG. 9. <S2> of FIG. 9 illustrates any state among a plurality of intermediate states between the unfolded state (<S1> of FIG. 9) and the fully folded state (<S3> of FIG. 9), and when the hinge structure 200 is in an intermediate folded state, the first rotary member 210 and the second rotary member 220 are not limited to forming the angle illustrated in <S2> of FIG. 9.

Figure 10:
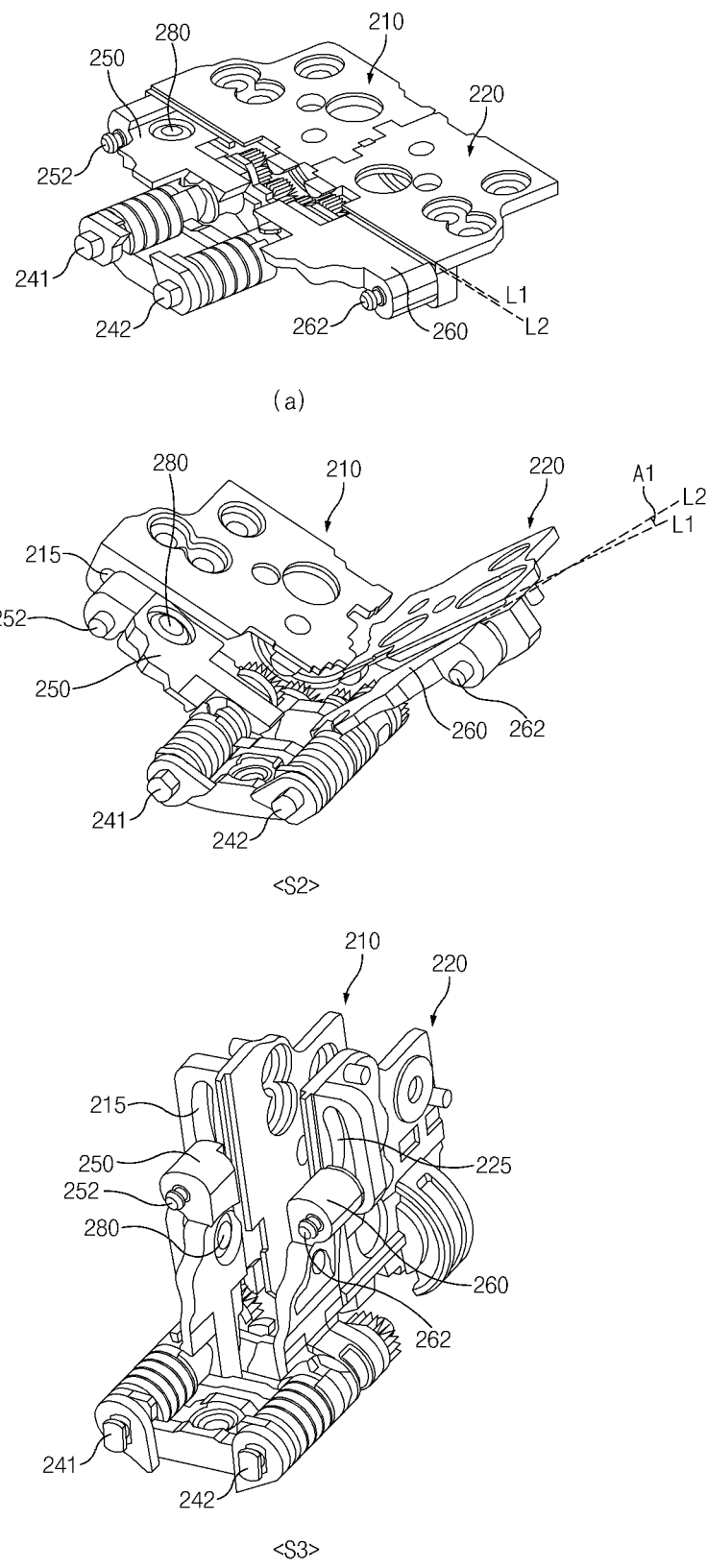
FIG. 10 illustrates rotary motions of arm members and the rotary members of the hinge structure according to an embodiment.
Figure 11:
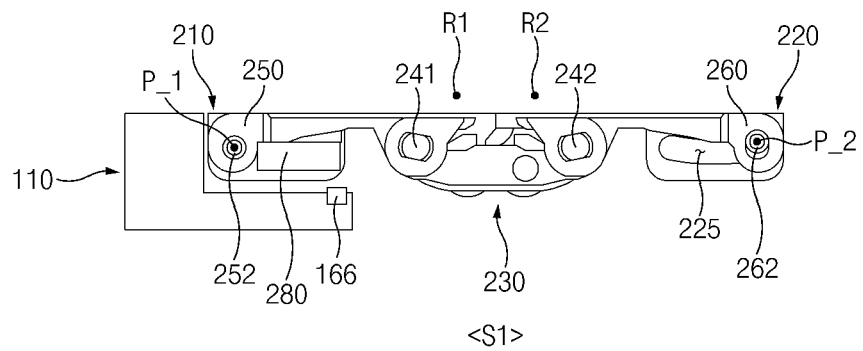
FIG. 11 illustrates rotary motions of the arm members and the rotary members of the hinge structure according to an embodiment.
Figure 11:
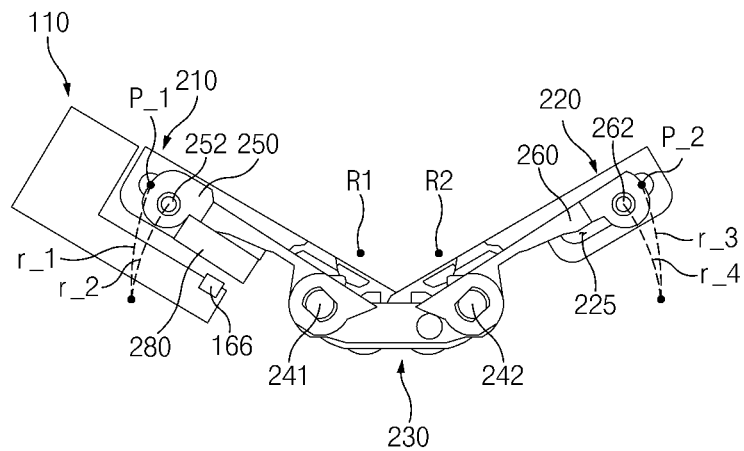
Figure 11:
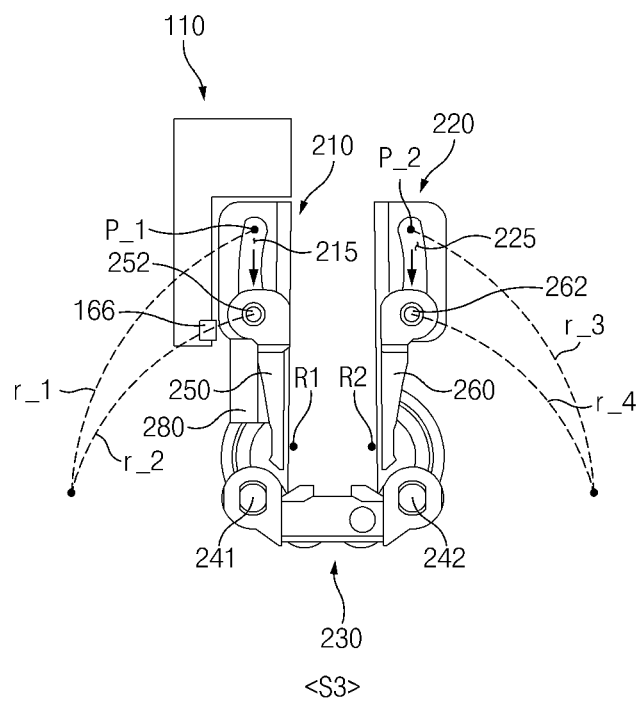

FIG. 10 illustrates rotary motions of the arm members and the rotary members of the hinge structure according to an embodiment. FIG. 11 illustrates rotary motions of the arm members and the rotary members of the hinge structure according to an embodiment.

<S1> of FIG. 10 and <S1> of FIG. 11 are views illustrating the hinge structure 200 in an unfolded state. <S2> of FIG. 10 and <S2> of FIG. 11 are views illustrating the hinge structure 200 in an intermediate folded state. <S3> of FIG. 10 and <S3> of FIG. 11 are views illustrating the hinge structure 200 in a fully folded state.

FIG. 10 is a view in which the fixed member 230 of the hinge structure 200 is omitted. FIG. 11 is a view of the hinge structure 200 as viewed in a direction D of FIG. 8.

Referring to FIGS. 10 and 11, the hinge structure 200 according to an embodiment may include the rotary members 210 and 220, the fixed member 230, the arm members 250 and 260, the arm shafts 241 and 242, and the magnet assembly 280.

The components of the hinge structure 200 illustrated in FIGS. 10 and 11 may be identical or similar to some of the components of the hinge structure 200 illustrated in FIGS. 3 to 9, and repetitive descriptions will hereinafter be omitted.

According to an embodiment, when the hinge structure 200 is folded or unfolded, the rotary members 210 and 220 and the arm members 250 and 260 may rotate about different axes. For example, the rotary members 210 and 220 and the arm members 250 and 260 may rotate along different rotational paths. Due to the difference in rotational path between the rotary members 210 and 220 and the arm members 250 and 260, the arm members 250 and 260 may slide relative to the rotary members 210 and 220 when the hinge structure 200 is folded or unfolded.

In an embodiment, the first rotary member 210 may rotate about the first axis of rotation R1 in a first rotational direction (e.g., refer to FIG. 9). For example, the first rotary member 210 may rotate in the clockwise direction in a folding motion and may rotate in the counterclockwise direction in an unfolding motion. As illustrated in FIG. 11, to describe the rotational path of the first rotary member 210, the point at which the first sliding pin 252 is located in the first sliding groove 215 of the first rotary member 210 in the unfolded state may be defined as a first point P_1. In folding and unfolding motions, the first point P_1 of the first rotary member 210 may move along a first rotational path r_1.

In an embodiment, the first arm member 250 and the first sliding pin 252 may rotate about the first arm shaft 241 spaced apart from the first axis of rotation R1. For example, the first arm member 250 and the first sliding pin 252 may rotate in the clockwise direction in a folding motion and may rotate in the counterclockwise direction in an unfolding motion. For example, in the unfolded state, the first sliding pin 252 may be located at the first point P_1, and in a folded state, the first sliding pin 252 may be located at a position spaced apart from the first point P_1 in a direction perpendicular to the axial directions. In folding and unfolding motions, the first sliding pin 252 may move along a second rotational path r_2.

In an embodiment, the first rotational path r_1 and the second rotational path r_2 may differ from each other. For example, the first axis of rotation R1 and the first arm shaft 241 may be parallel to each other, but they may not coincide with each other. Accordingly, the rotational paths of the first rotary member 210 and the first arm member 250 may be formed to be different from each other.

In an embodiment, the first arm member 250 and the first sliding pin 252 may slide relative to the first rotary member 210 in folding and unfolding motions of the hinge structure 200. The sliding motion of the first sliding pin 252 and the first arm member 250 may be guided as the first sliding pin 252, which may be press-fit into the first arm member 250, is accommodated in the first sliding groove 215 of the first rotary member 210. For example, when the hinge structure 200 is folded or unfolded, the first sliding pin 252 may rotate about the first arm shaft 241 along the second rotational path r_2 while sliding along the first sliding groove 215. As illustrated in FIG. 11, when a folding motion is performed in the unfolded state, the distance between the first sliding pin 252 and the first point P_1 may increase. When an unfolding motion is performed in the fully folded state, the distance between the first sliding pin 252 and the first point P_1 may decrease.

In an embodiment, the second rotary member 220 may rotate about the second axis of rotation R2 in a second rotational direction (e.g., refer to FIG. 9). For example, the second rotary member 220 may rotate in the counterclockwise direction in a folding motion and may rotate in the clockwise direction in an unfolding motion. As illustrated in FIG. 11, to describe the rotational path of the second rotary member 220, the point at which the second sliding pin 262 is located in the second sliding groove 225 of the second rotary member 220 in the unfolded state may be defined as a second point P_2. In folding and unfolding motions, the second point P_2 of the second rotary member 220 may move along a third rotational path r_3.

In an embodiment, the second arm member 260 and the second sliding pin 262 may rotate about the second arm shaft 242 that is spaced apart from the second axis of rotation R2. For example, the second arm member 260 and the second sliding pin 262 may rotate in the counterclockwise direction in a folding motion, and may rotate in the clockwise direction in an unfolding motion. For example, in the unfolded state, the second sliding pin 262 may be located at the second point P_2, and in a folded state, the second sliding pin 262 may be located at a position spaced apart from the second point P_2 in a direction perpendicular to the axial directions. In folding and unfolding motions, the second sliding pin 262 may move along a fourth rotational path r_4.

In certain embodiments, the third rotational path r_3 and the fourth rotational path r_4 may differ from each other. For example, the second axis of rotation R2 and the second arm shaft 242 may be parallel to each other, but may not coincide with each other. Accordingly, the rotational paths of the second rotary member 220 and the second arm member 260 may be formed to be different from each other.

In an embodiment, the second arm member 260 and the second sliding pin 262 may slide relative to the second rotary member 220 in folding and unfolding motions of the hinge structure 200. The sliding motion of the second sliding pin 262 and the second arm member 260 may be guided as the second sliding pin 262 press-fit into the second arm member 260 is accommodated in the second sliding groove 225 of the second rotary member 220. For example, when the hinge structure 200 is folded or unfolded, the second sliding pin 262 may rotate about the second arm shaft 242 along the fourth rotational path r_4 while sliding along the second sliding groove 225. As illustrated in FIG. 11, when a folding motion is performed in the unfolded state, the distance between the second sliding pin 262 and the second point P_2 may increase. When an unfolding motion is performed in the fully folded state, the distance between the second sliding pin 262 and the second point P_2 may decrease.

According to an embodiment, as the rotary members 210 and 220 and the arm members 250 and 260 rotate about different axes, the relative positions of the rotary members 210 and 220 and the arm members 250 and 260 may be changed when folding and unfolding motions are performed. For example, a difference in angle between the rotary members 210 and 220 and the arm members 250 and 260 may occur in response to a state of the hinge structure 200.

Referring to FIG. 10, to describe the angle difference, two virtual extension lines may be defined, including a first virtual extension line L1 extending from a part of the rotary members 210 and 220 in a direction perpendicular to the arm shafts 241 and 242 or the axes of rotation R1 and R2, and a second virtual extension line L2 extending from a part of the arm members 250 and 260 in a direction perpendicular to the arm shafts 241 and 242 or the axes of rotation R1 and R2. In the unfolded state of the hinge structure 200, the first extension line L1 and the second extension line L2 may be substantially parallel to each other (<S1> of FIG. 10). When a folding motion is performed in the unfolded state, the first extension line L1 and the second extension line L2 may form a specified included angle A1 as the sliding pins 252 and 262 slide along the sliding grooves 215 and 225 (<S2> of FIG. 10). The included angle A1 may increase and then decrease as the folding motion is continually performed. In the fully folded state, the first extension line L1 and the second extension line L2 may be substantially parallel to each other (<S3> of FIG. 10).

In an embodiment, the magnet assembly 280 may be coupled to the first arm member 250 and may rotate about the first arm shaft 241 together with the first arm member 250. The first housing 110 of the electronic device 100 may be connected with the first rotary member 210 and may rotate about the first axis of rotation R1 together with the first rotary member 210. A sensor 166 (e.g., a Hall sensor) that senses the magnetic force of the magnet assembly 280 (e.g., the magnet 281) may be disposed in the first housing 110. The first housing 110 and the sensor 166 illustrated in FIG. 11 may be schematically represented to describe the positions of the first rotary member 210 and the first arm member 250 depending on a rotary motion.

According to an embodiment, the distance between the sensor 166 and the magnet assembly 280 may be changeable with folding and unfolding motions as the axes of rotation of the first rotary member 210 and the first arm member 250 differ from each other. For example, when folding and unfolding motions of the electronic device 100 (or, the hinge structure 200) are performed, the first rotary member 210 and the first arm member 250 may rotate along different rotational paths, and a partial angle difference therebetween may occur. Accordingly, the distance between the magnet assembly 280 and the sensor 166 may be changed. In response to the change in the distance between the magnet assembly 280 and the sensor 166, the sensor 166 may detect the degree to which the strength of the magnetic force of the magnet assembly 280 changes, and the processor of the electronic device 100 (e.g., the processor 320 of FIG. 17) may determine a state of the electronic device 100, based on the information sensed by the sensor 166.

According to an embodiment, the magnet 281 included in the magnet assembly 280 may include a plurality of different polarities. For example, the magnet 281 may be formed such that the plurality of polarities (e.g., an N pole and an S pole) are arranged in a direction perpendicular to the direction in which the sensor 166 moves relative to the magnet assembly 280 (e.g., the x-axis direction of FIG. 1 or the direction of movement of the first sliding pin 252 based on FIG. 11). However, without being limited to the above-described example, the magnet 281 may be formed to include one polarity according to certain embodiments.

According to an embodiment, in response to a change in the position of the sensor 166 relative to the magnet assembly 280, the sensor 166 may sense the degree to which the strength of the magnetic force of the magnet assembly 280 changes and/or the direction of the magnetic force. For example, the magnet 281 included in the magnet assembly 280 may be formed such that a plurality of polarities (e.g., an N pole and an S pole) are arranged in a direction parallel to the direction in which the sensor 166 moves relative to the magnet assembly 280 (e.g., the x-axis direction of FIG. 1 or the direction of movement of the first sliding pin 252 based on FIG. 11) and may sense the degree to which the strength of the magnetic force of the magnet assembly 280 changes and/or the direction of the magnetic force in response to a change in the position of the sensor 166 relative to the magnet 281.

Figure 12:
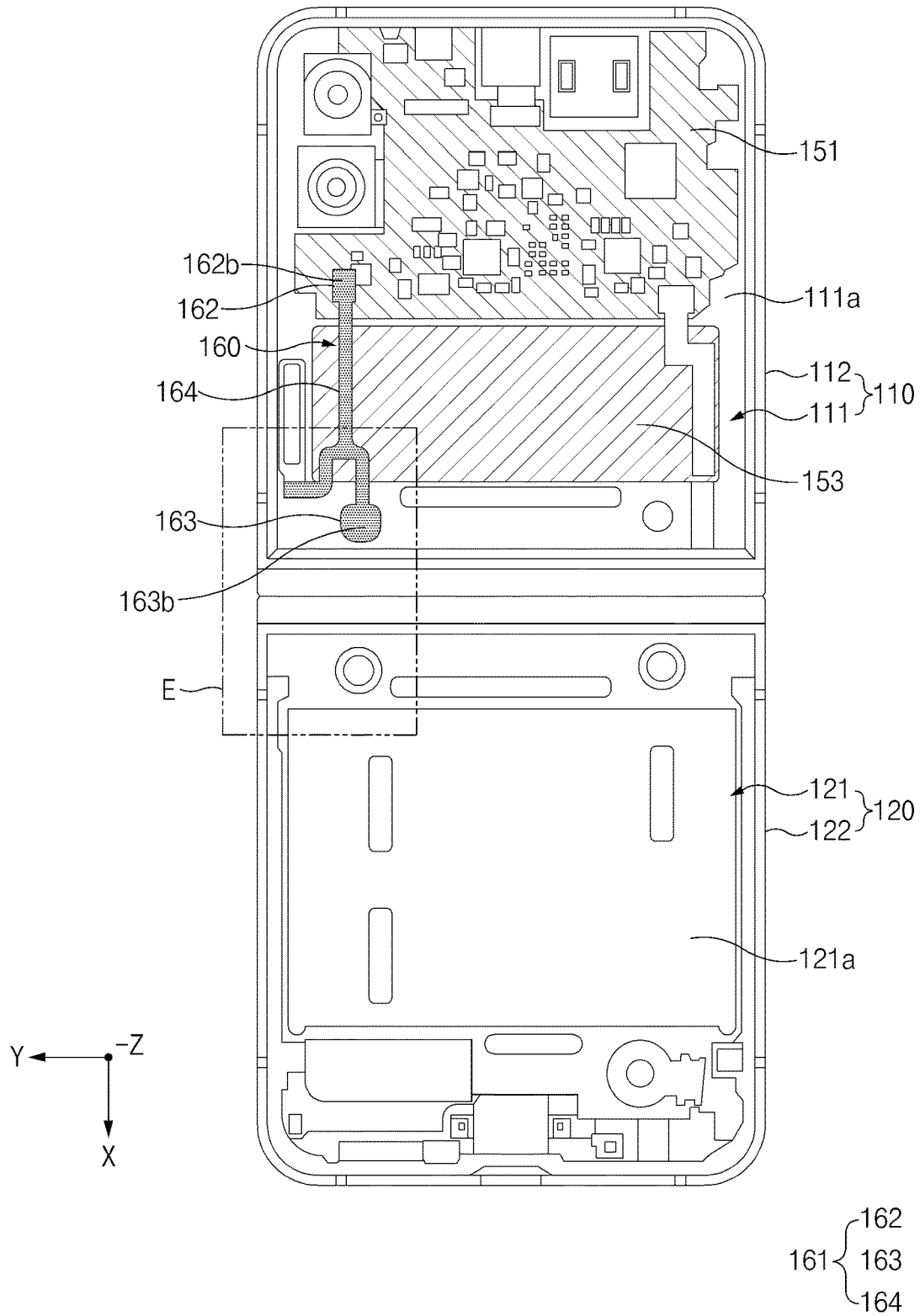
FIG. 12 illustrates a portion of the electronic device according to an embodiment.
Figure 13:
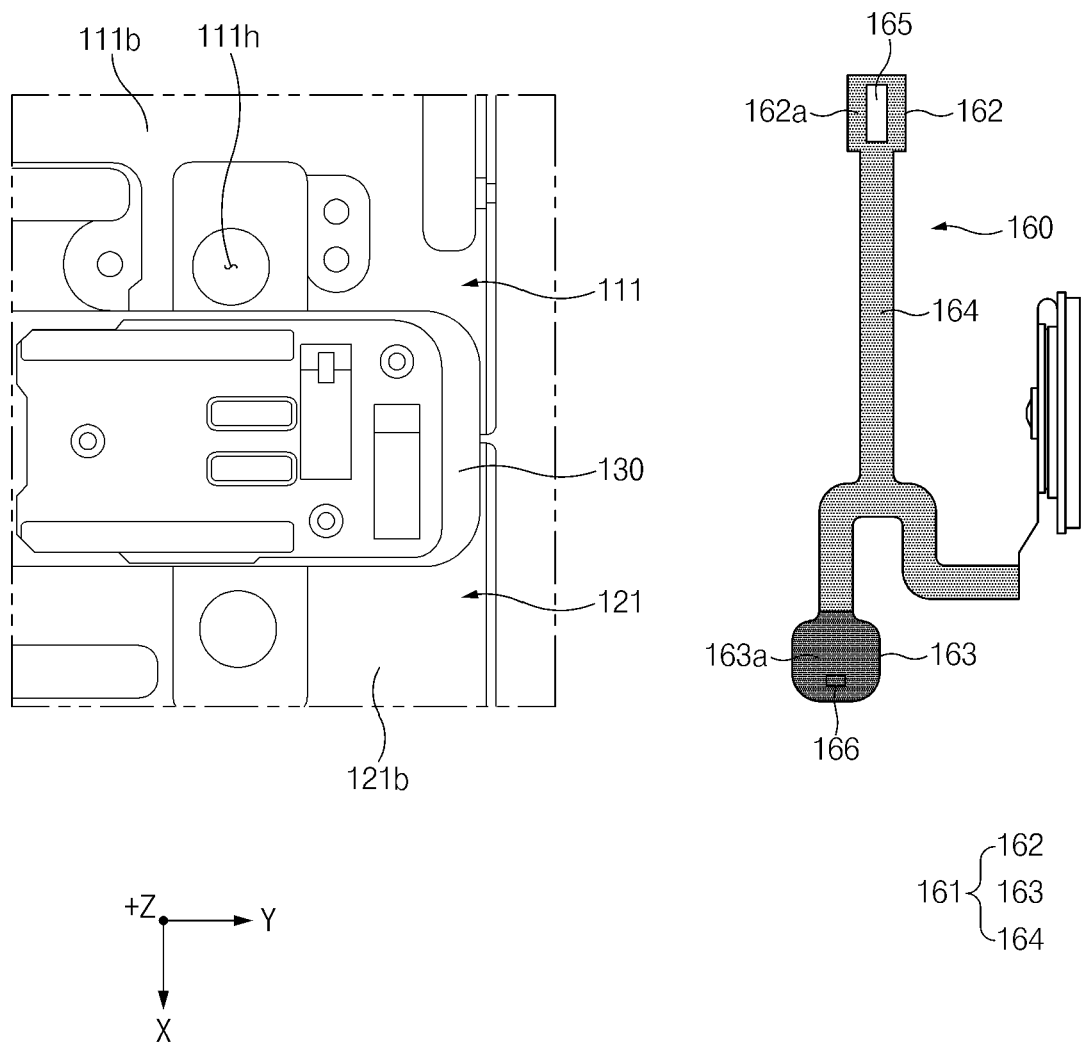
FIG. 13 illustrates the housings and a sensor module of the electronic device according to an embodiment.
Figure 14:
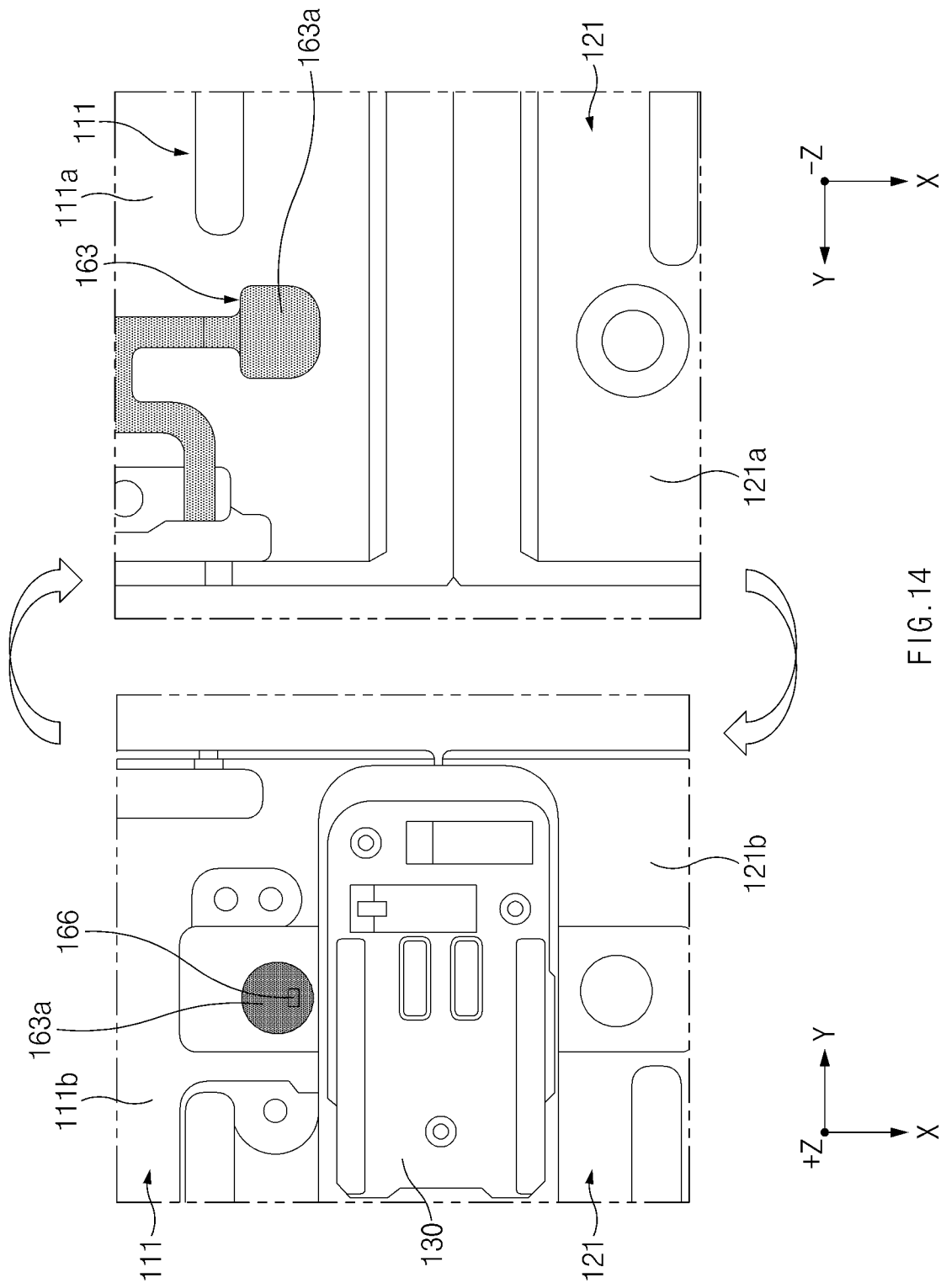
FIG. 14 illustrates the housings and the sensor module of the electronic device according to an embodiment.

FIG. 12 illustrates a portion of the electronic device according to an embodiment. FIG. 13 illustrates the housings and the sensor module of the electronic device according to an embodiment. FIG. 14 illustrates the housings and the sensor module of the electronic device according to an embodiment.

FIG. 13 is a view illustrating a state in which the sensor module 160 is separated from the first housing 110, and FIG. 14 is a view illustrating a state in which the sensor module 160 is coupled to the first housing 110. FIGS. 13 and 14 are enlarged views of portion E of FIG. 12.

Referring to FIGS. 12 to 14, the electronic device 100 according to an embodiment may include the first housing 110, the second housing 120, the hinge housing 130, the first circuit board 151 (e.g., the first circuit board 151 of FIG. 1), the first battery 153 (e.g., the first battery 153 of FIG. 1), and the sensor module 160.

The components of the electronic device 100 illustrated in FIGS. 12 and 13 may be identical or similar to some of the components of the electronic device 100 illustrated in FIG. 1, and repetitive descriptions will hereinafter be omitted.

In an embodiment, the first housing 110 may include the first plate 111 and the first frame 112. The second housing 120 may include the second plate 121 and the second frame 122. For example, FIG. 12 is a view of the electronic device 100 as viewed in the −z-axis direction in the state in which the first circuit board 151 and the first battery 153 are coupled to the first housing 110 based on FIG. 1.

In an embodiment, the first plate 111 may include a first surface 111a (e.g., a surface facing the −z-axis direction based on FIG. 1) on which the first circuit board 151 and the first battery 153 are disposed and a second surface 111b (e.g., a surface facing the +z-axis direction based on FIG. 1) that faces away from the first surface 111a. For example, the first surface 111a of the first plate 111 may refer to the surface partially facing the first back cover (e.g., the first back cover 119 of FIG. 1), and the second surface 111b of the first plate 111 may refer to the surface partially facing the display (e.g., the display 140 of FIG. 1).

In an embodiment, the second plate 121 may include a third surface 121a facing the same direction as the first surface 111a of the first plate 111 in an unfolded state and a fourth surface 121b facing away from the third surface 121a. Referring to FIG. 1 together, the second circuit board (e.g., the second circuit board 152 of FIG. 1) and the second battery (e.g., the second battery 154 of FIG. 1) may be disposed on the third surface 121a of the second plate 121. For example, the third surface 121a of the second plate 121 may refer to the surface partially facing the second back cover (e.g., the second back cover 129 of FIG. 1), and the fourth surface 121b of the second plate 121 may refer to the surface partially facing the display (e.g., the display 140 of FIG. 1).

In an embodiment, a portion (e.g., the depression 114 of FIG. 1) of the second surface 111b of the first plate 111 and a portion (e.g., the depression 124 of FIG. 1) of the fourth surface 121b of the second plate 121 may overlap the hinge housing 130. Although not illustrated, the hinge structure 200 may be coupled to the second surface 111b of the first plate 111 and the fourth surface 121b of the second plate 121 such that at least a portion of the hinge structure 200 overlaps the hinge housing 130 (e.g., refer to FIG. 8). For example, the first rotary member 210 of the hinge structure 200 may be connected to the second surface 111b of the first plate 111, and the second rotary member 220 of the hinge structure 200 may be connected to the fourth surface 121b of the second plate 121.

In an embodiment, the sensor module 160 may be disposed in the first housing 110, and at least a portion of the sensor module 160 may be electrically connected with the first circuit board 151. The sensor module 160 may include a flexible circuit board 161 (e.g., a flexible printed circuit board (FPCB)) and the sensor 166 (e.g., a Hall sensor). For example, the flexible circuit board 161 may be electrically connected with the first circuit board 151, and the sensor 166 may be disposed (or, mounted) on a partial area of the flexible circuit board 161 so as to be electrically connected with the flexible circuit board 161.

In an embodiment, the flexible circuit board 161 may be disposed on the first plate 111. For example, at least a portion of the flexible circuit board 161 may be disposed on the first surface 111a of the first plate 111. At least a portion of the flexible circuit board 161 may extend in a direction (e.g., the x-axis direction) from the first circuit board 151 toward the second housing 120 across the first battery 153. In certain embodiments, the flexible circuit board 161 may be configured such that one portion is located on the first surface 111a and another portion passes through the first plate 111 and is located on the second surface 111b.

In an embodiment, the flexible circuit board 161 may include a first portion 162 on which a connector 165 is disposed, a second portion 163 on which the sensor 166 is disposed, and a third portion 164 connecting the first portion 162 and the second portion 163. For example, the first portion 162 may be disposed on the first circuit board 151, the second portion 163 may be disposed in a sensor hole 111h formed in the first plate 111, and the third portion 164 may extend from the first portion 162 to the second portion 163. For example, the third portion 164 may extend partially across the first battery 153.

In an embodiment, the first portion 162 may include a first area 162a on which the connector 165 is disposed (or, mounted) and a second area 162b facing away from the first area 162a. The second portion 163 may include a third area 163a on which the sensor 166 is disposed (or, mounted) and a fourth area 163b facing away from the third area 163a. The flexible circuit board 161 may be disposed on the first plate 111 such that the first area 162a and the third area 163a face the first surface 111a of the first plate 111. For example, the flexible circuit board 161 may be disposed on the first plate 111 such that the second area 162b of the first portion 162 and the fourth area 163b of the second portion 163 face the same direction (e.g., the −z-axis direction based on FIG. 12) as the first surface 111a of the first plate 111.

Hereinafter, an arrangement structure of the sensor module 160 will be described with reference to FIGS. 13 and 14. For example, FIG. 14 illustrates views of the first housing 110 having the sensor module 160 coupled thereto as viewed in the directions toward the first surface 111a and the second surface 111b.

In an embodiment, the sensor module 160 may be fixedly disposed in the first housing 110. For example, the sensor module 160 may rotate together with the first housing 110 in folding and unfolding motions of the electronic device 100 as the flexible circuit board 161 is fixedly disposed on the first plate 111.

In an embodiment, the first plate 111 may include the sensor hole 111h penetrating the first surface 111a and the second surface 111b of the first plate 111. For example, the sensor hole 111h may be formed in an area of the first plate 111 that is adjacent to the hinge housing 130. Although not illustrated, the sensor hole 111h may overlap the hinge structure 200 and may partially face the first arm member 250 of the hinge structure 200 (e.g., refer to FIG. 8). The sensor hole 111h may partially overlap the second portion 163 of the flexible circuit board 161. For example, the sensor hole 111h may be aligned with the second portion 163 of the flexible circuit board 161 in the z-axis direction, and at least a portion of the sensor 166 disposed on the second portion 163 may be located in the sensor hole 111h.

In an embodiment, the flexible circuit board 161 may be disposed on the first surface 111a of the first plate 111 such that the second portion 163 partially overlaps the sensor hole 111h. As seen in FIG. 14, the sensor hole 111h may be hidden by the second portion 163 (the fourth area 163b), when the first surface 111a of the first plate 111 is viewed from above (e.g., when the first plate 111 is viewed in the −z-axis direction). When the second surface 111b of the first plate 111 is viewed from above (e.g., when the first plate 111 is viewed in the +z-axis direction), at least a portion (or, the third area 163a) of the second portion 163 may overlap the sensor hole 111h, and the sensor 166 may be disposed within the sensor hole 111h. In certain embodiments, the second portion 163 may be attached to the first surface 111a of the first plate 111 through an adhesive member (not illustrated). For example, an adhesive member may be disposed on (or, applied to) the third area 163a of the second portion 163, and the third area 163a may be attached to an area of the first surface 111a around the sensor hole 111h.

In an embodiment, the sensor 166 may be visually exposed on the second surface 111b of the first plate 111 through the sensor hole 111h. For example, when the second surface 111b is viewed from above, the sensor 166 may be visually exposed through the sensor hole 111h. Although not illustrated, the sensor 166 may partially face the magnet assembly 280 on the first arm member 250 through the sensor hole 111h when the hinge structure 200 is coupled to the housings 110 and 120. An arrangement structure of the sensor 166 and the magnet assembly 280 will be described below in more detail with reference to FIG. 15.

Figure 15:
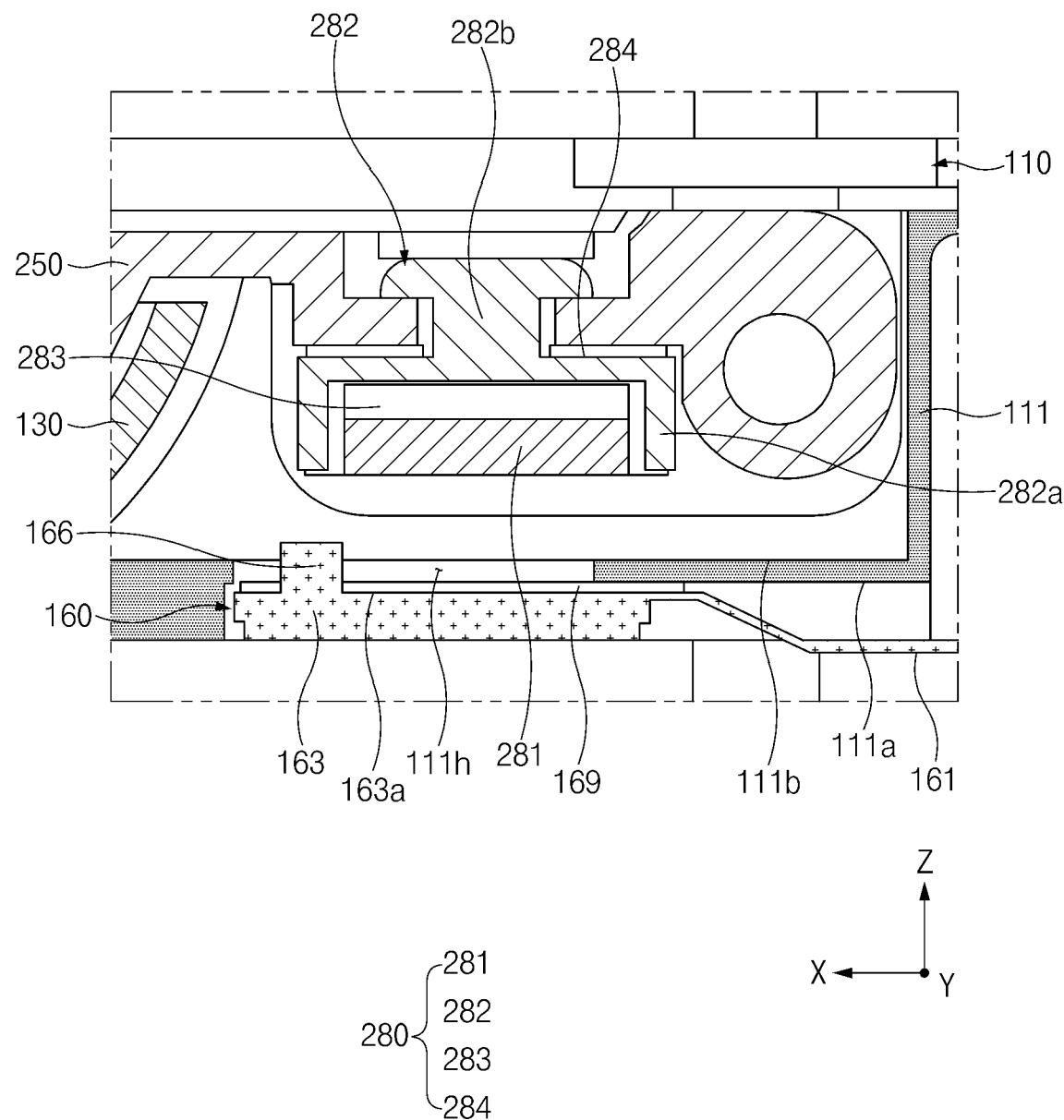
FIG. 15 is a sectional view of a portion of the electronic device according to an embodiment.

FIG. 15 is a sectional view of a portion of the electronic device according to an embodiment.

FIG. 15 is a sectional view of the electronic device 100 taken along line C-C' in FIG. 8. For example, FIG. 15 is a view illustrating a section in substantially the same direction as a section of the electronic device 100 taken along line F-F' in FIG. 14.

Referring to FIG. 15, the electronic device 100 according to an embodiment may include the first housing 110, the hinge housing 130, the sensor module 160, and the hinge structure 200. In an embodiment, the hinge structure 200 may include the first arm member 250 and the magnet assembly 280, and the magnet assembly 280 may include the magnet bracket 282, the magnet 281, the first adhesive member 284, and the second adhesive member 283.

Some of the components of the electronic device 100 illustrated in FIG. 15 may be identical or similar to some of the components of the electronic device 100 illustrated in FIGS. 3 to 14, and repetitive descriptions will hereinafter be omitted.

According to an embodiment, the magnet assembly 280 may move together with the first arm member 250 as the first arm member 250 rotates in folding and unfolding motions. The magnet assembly 280 may be disposed on the first arm member 250 such that the magnet 281 faces the sensor 166 of the sensor module 160. For example, the magnet bracket 282 may be coupled to the first arm member 250 such that the receiving portion 282a faces the second surface 111b of the first plate 111 and the protruding portion 282b passes through a portion of the first arm member 250.

In an embodiment, the magnet 281 may be accommodated in the receiving portion 282a of the magnet bracket 282. The receiving portion 282a may be attached to a partial area of the first arm member 250 through the first adhesive member 284. The magnet 281 may be disposed such that one surface (e.g., the surface facing the −z-axis direction) faces the second surface 111b or the sensor hole 111h of the first plate 111. For example, the one surface of the magnet 281 may be exposed outside the receiving portion 282a so as to face toward the sensor 166. The magnet 281 may be fixedly disposed in the receiving portion 282a. For example, the magnet 281 may be attached to the receiving portion 282a through the second adhesive member 283.

According to an embodiment, the sensor module 160 may move together with the first housing 110 as the first housing 110 rotates in folding and unfolding motions. For example, the center of rotation of the first housing 110 and the center of rotation of the first arm member 250 may differ from each other (e.g., refer to FIG. 11). Accordingly, when the electronic device 100 is folded or unfolded, the relative positions of the sensor 166 of the sensor module 160 and the magnet 281 of the magnet assembly 280 may be changed.

In an embodiment, the sensor module 160 may include the flexible circuit board 161 and the 166 disposed on at least a portion of the flexible circuit board 161. The flexible circuit board 161 may be disposed on the first plate 111 of the first housing 110. For example, the flexible circuit board 161 may be disposed on the first surface 111a of the first plate 111. The sensor 166 may be disposed (or, mounted) on the second portion 163 of the flexible circuit board 161. For example, the sensor 166 may be disposed on the third area 163a of the second portion 163 to partially face the magnet assembly 280.

Figure 16:
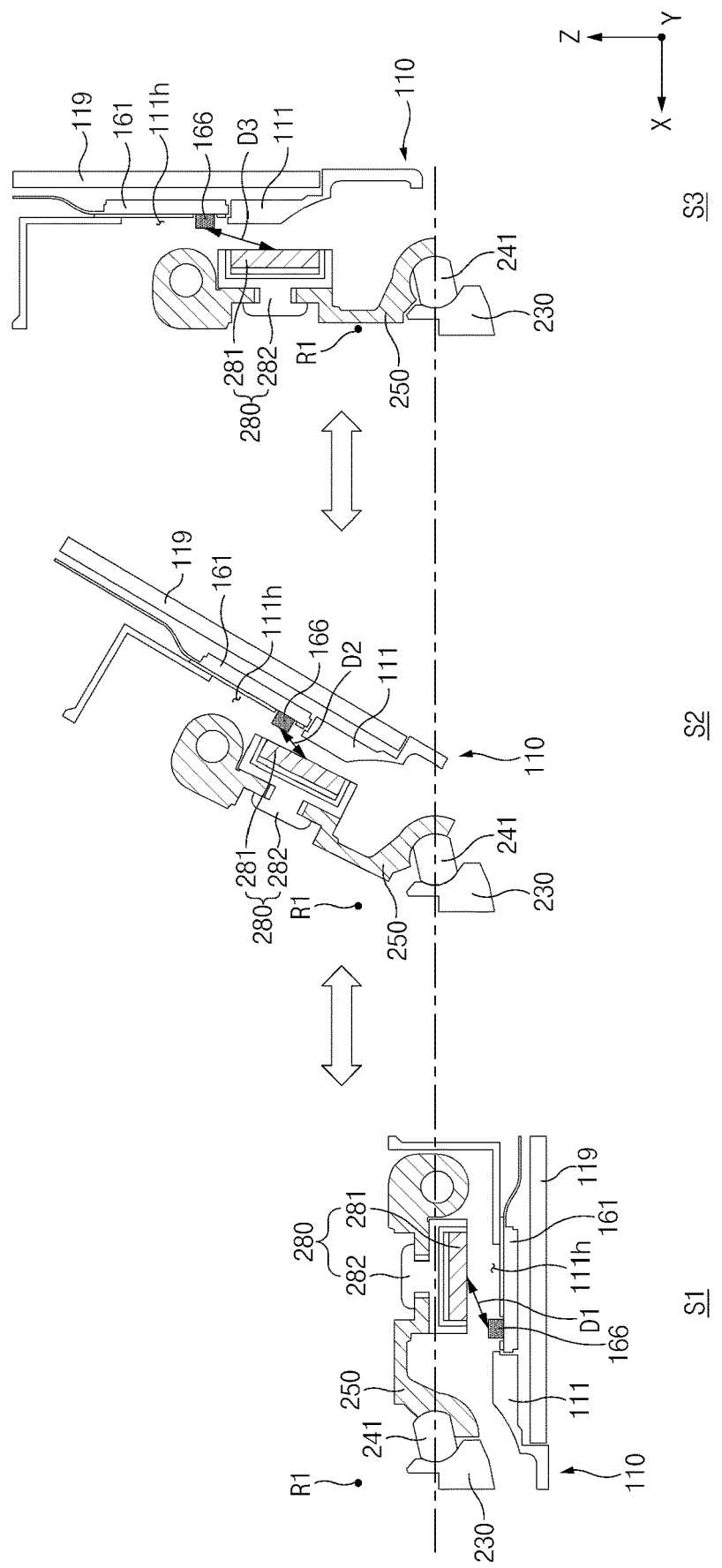
FIG. 16 illustrates an operation in which the distance between a magnet and a sensor is changed in response to a state of the electronic device according to an embodiment.

In an embodiment, at least a portion of the sensor 166 may be located in the sensor hole 111h and may face the magnet assembly 280 through the sensor hole 111h. The second portion 163 of the flexible circuit board 161 may be attached to the first surface 111a of the first plate 111 to cover the sensor hole 111h, and the sensor 166 may be accommodated in the sensor hole 111h. For example, the third area 163a of the second portion 163 may be attached to the second surface 111b via an adhesive member 169. As illustrated in FIG. 16, the second portion 163 may be disposed on the second surface 111b so as to overlap the sensor hole 111h in the z-axis direction. Accordingly, the sensor 166 may be disposed to pass through the sensor hole 111h and face the magnet assembly 280.

In an embodiment, the sensor 166 may be a magnetic sensor (e.g., a Hall sensor) that senses the magnitude and/or direction of a magnetic field. The sensor 166 may sense at least one of the strength or the direction of the magnetic field of the magnet 281, or may sense a change in the magnetic field at a specific point. For example, the distance between the sensor 166 and the magnet 281 may vary depending on states of the electronic device 100, and the sensor 166 may detect a change in the strength and/or the direction of the magnetic field of the magnet 281 in response to the change of the distance.

In certain embodiments, the electronic device 100 (e.g., the processor 320 of FIG. 17) may detect or obtain information about a state of the electronic device 100, based on the strength and/or the direction of the magnetic field of the magnet 281 that is sensed by the sensor 166. For example, the processor 320 may detect a folding angle of the electronic device 100 using the strength or the direction of the magnetic field sensed by the sensor 166. In certain embodiments, the folding angle may be an angle indicating the degree to which the electronic device 100 is folded or unfolded. For example, the folding angle may refer to the angle between the first housing 110 and the second housing 120 or the angle between the first area (e.g., the first area 141 of FIG. 1) and the second area (e.g., the second area 142 of FIG. 1) with respect to the folding area (e.g., the folding area 143 of FIG. 1) of the display (e.g., the display 140 of FIG. 1).

According to an embodiment, the electronic device 100 may accurately sense the state information or the folding angle of the electronic device 100 as the sensor 166 and the magnet 281 are located close to each other. For example, when the sensor 166 and the magnet 281 are located far away from each other, the strength of the magnetic field of the magnet 281 sensed by the sensor 166 may be decreased, and there may be a limitation in accurate sensing. The sensor 166 may be disposed close to the magnet 281 to directly face the magnet 281, and thus the amount of change in the magnetic field of the magnet 281 sensed by the sensor 166 may be sufficient as to enable accurate detection. Accordingly, the electronic device 100 according to an embodiment may accurately detect the state information or the folding angle of the electronic device 100.

FIG. 16 illustrates an operation in which the distance between the magnet and the sensor is changed, in response to changes in the state of the electronic device according to an embodiment.

Referring to FIG. 16, the electronic device 100 according to an embodiment may be deformed or switched between an unfolded state S1 (e.g., the unfolded state of FIG. 2A or <S1> of FIGS. 9, 10, and 11), an intermediate state S2 (e.g., the intermediate folded state of FIG. 2B or <S2> of FIGS. 9, 10, and 11), and a folded state S3 (e.g., the fully folded state of FIG. 2C or <S3> of FIGS. 9, 10, and 11). As described above, the electronic device 100 may be folded or unfolded as the first housing 110 and the second housing 120 rotate based on the hinge structure 200. In this case, the rotary members 210 and 220 of the hinge structure 200 may rotate about the virtual axes of rotation R1 and R2 together with the housings 110 and 120, and the arm members 250 and 260 of the hinge structure 200 may rotate about the arm shafts 241 and 242 (e.g., refer to FIG. 11).

In an embodiment, the magnet 281 may be fixed to the first arm member 250 through the magnet bracket 282. The sensor 166 may be disposed on the flexible circuit board 161 fixed to the first plate 111. The sensor 166 may be located in the sensor hole 111h formed in the first plate 111 and may face the magnet assembly 280 through the sensor hole 111h.

In an embodiment, the position of the magnet assembly 280 (or, the magnet 281) relative to the sensor 166 may be changed in response to changes in the state of the electronic device 100. For example, the distance between the sensor 166 and the magnet 281 and/or the position of the sensor 166 relative to the magnet 281 may be changed as the state of the electronic device 100 is changed. The sensor 166 and the flexible circuit board 161 may move together with the first housing 110 in the state of being disposed on the first plate 111 as the first housing 110 (the first plate 111 and the first back cover 119) rotate about the first axis of rotation R1. The magnet assembly 280 may move together with the first arm member 250 in the state of being disposed on the first arm member 250, as the first arm member 250 rotates about the first arm shaft 241. Accordingly, in a folding or unfolding motion of the electronic device 100, the movement displacement (e.g., distance or direction) of the magnet 281 and the movement displacement of the sensor 166 may differ from each other.

In an embodiment, the distance between the magnet 281 and the sensor 166 and/or the position of the sensor 166 relative to the magnet 281 may be changed in response to each state of the electronic device 100. Hereinafter, the distance between the magnet 281 and the sensor 166 may refer to the distance between the center of the magnet 281 and the center of the sensor 166 when the section of the electronic device 100 is viewed, and the position of the sensor 166 relative to the magnet 281 may refer to the direction (e.g., the left side or the right side) in which the center of the sensor 166 is located with respect to the center of the magnet 281.

In an embodiment, the distance between the sensor 166 and the magnet 281 may be greater in the folded state S3 than in the unfolded state S1, and when the electronic device 100 is changed from the unfolded state S1 to the folded state S3, the sensor 166 and the magnet 281 may become closer to each other and thereafter may be spaced farther away from each other after a specific state. The strength (e.g., the magnetic flux density) of the magnetic field of the magnet 281 detected by the sensor 166 may vary depending on the distance between the sensor 166 and the magnet 281. For example, the strength (the magnetic flux density) of the magnetic field may be gradually increased as the sensor 166 and the magnet 281 become closer to each other, and may be gradually decreased as the sensor 166 and the magnet 281 are spaced farther away from each other.

According to an embodiment, in the unfolded state S1, the distance between the sensor 166 and the magnet 281 may be a first distance D1, and the sensor 166 may be located on the left side with respect to the center of the magnet 281. For example, the first distance D1 may range from about 2.1 mm to about 2.3 mm and may be about 2.22 mm, but is not limited thereto. As a folding motion is performed in the unfolded state S1, the sensor 166 may move in a direction toward the center of the magnet 281, and at a specified folding angle, the center of the sensor 166 may be aligned with the center of the magnet 281. Thereafter, as the electronic device 100 is continually folded (e.g., as the folding angle is decreased), the sensor 166 may move so as to be located further on the right side with respect to the center of the magnet 281. For example, the folding angle may refer to the angle between the first housing 110 and the second housing 120 as described above.

According to an embodiment, in the intermediate state S2, the distance between the sensor 166 and the magnet 281 may be a second distance D2, and the sensor 166 may be located on the right side with respect to the center of the magnet 281. The second distance D2 may be smaller than the first distance D1. For example, the second distance D2 may range from about 0.9 mm to about 1.1 mm and may be about 1.03 mm, but is not limited thereto. The intermediate state S2 illustrated in FIG. 16 may be referred to as any state among a plurality of intermediate folded states between the unfolded state S1 and the folded state S3. Based on FIG. 16, for example, the intermediate state S2 may refer to the state in which the first housing 110 is rotated by about 60 degrees in the counterclockwise direction in the unfolded state S1.

According to an embodiment, in the folded state S3, the distance between the sensor 166 and the magnet 281 may be a third distance D3, and the sensor 166 may be located on the right side with respect to the center of the magnet 281. The third distance D3 may be greater than the first distance D1. For example, the third distance D3 may range from about 2.5 mm to about 2.7 mm and may be about 2.6 mm, but is not limited thereto. Based on FIG. 16, the folded state S3 may refer to the state in which the first housing 110 is rotated by about 90 degrees in the counterclockwise direction in the unfolded state S1.

According to certain embodiments, an intermediate folded state may be understood as including a plurality of states in which the distance between the sensor 166 and the magnet 281 is between the first distance D1 and the third distance D3.

The electronic device 100 according to an embodiment may determine a state (e.g., a folding angle) of the electronic device 100 depending on the magnetic flux density (or, the strength of the magnetic field) sensed by the sensor 166. The electronic device 100 may determine a state of the electronic device 100 using parameter information about folding angles stored therein. For example, the processor of the electronic device 100 (e.g., the processor 320 of FIG. 17) may sense the strength of the magnetic field using the sensor 166 and may calculate a folding angle corresponding to the sensed magnetic field strength by using parameter information about folding angles stored in the memory (e.g., memory 330 of FIG. 17).

According to the embodiment illustrated in FIG. 16, the magnet 281 may move in the x-axis direction relative to the sensor 166 based on the unfolded state S1. However, without being limited thereto, in certain embodiments, the magnet 281 may be moved in the y-axis direction relative to the sensor 166 based on the unfolded state S1, and the processor of the electronic device 100 may sense the strength of a magnetic field based on the movement of the magnet 281, and may calculate a folding angle corresponding to the sensed magnetic field strength.

According to certain embodiments, the electronic device 100 may perform a specified operation, based on the calculated folding angle. For example, the processor 320 may control a screen on the display 140 in response to the folding angle. In another example, the processor 320 may determine whether to execute a specific application, or may determine a format in which a specific application is displayed on the display 140, based on the folding angle.

Figure 17:
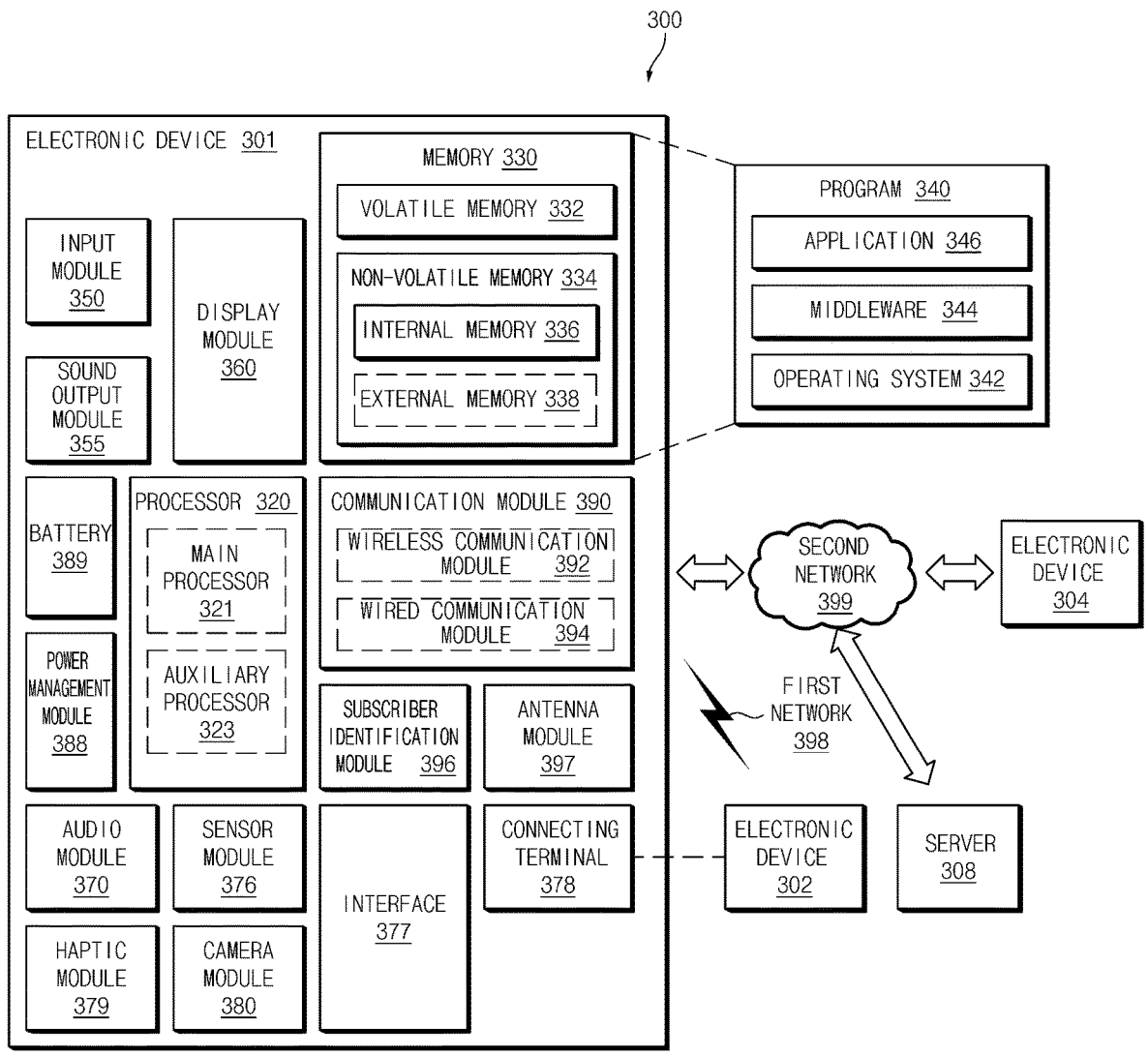
FIG. 17 is a block diagram of an electronic device in a network environment according to certain embodiments.

FIG. 17 is a block diagram of an electronic device in a network environment according to certain embodiments.

Referring to FIG. 17, the electronic device 301 in the network environment 300 may communicate with an electronic device 302 via a first network 398 (e.g., a short-range wireless communication network), or at least one of an electronic device 304 or a server 308 via a second network 399 (e.g., a long-range wireless communication network). According to an embodiment, the electronic device 301 may communicate with the electronic device 304 via the server 308. According to an embodiment, the electronic device 301 may include the processor 320, the memory 330, an input module 350, a sound output module 355, a display module 360, an audio module 370, a sensor module 376, an interface 377, a connecting terminal 378, a haptic module 379, a camera module 380, a power management module 388, a battery 389, a communication module 390, a subscriber identification module (SIM) 396, or an antenna module 397. In some embodiments, at least one of the components (e.g., the connecting terminal 378) may be omitted from the electronic device 301, or one or more other components may be added in the electronic device 301. In some embodiments, some of the components (e.g., the sensor module 376, the camera module 380, or the antenna module 397) may be implemented as a single component (e.g., the display module 360).

The processor 320 may execute, for example, software (e.g., a program 340) to control at least one other component (e.g., a hardware or software component) of the electronic device 301 coupled with the processor 320, and may perform various data processing or computation. According to an embodiment, as at least part of the data processing or computation, the processor 320 may store a command or data received from another component (e.g., the sensor module 376 or the communication module 390) in volatile memory 332, process the command or the data stored in the volatile memory 332, and store resulting data in non-volatile memory 334. According to an embodiment, the processor 320 may include a main processor 321 (e.g., a central processing unit (CPU) or an application processor (AP)), or an auxiliary processor 323 (e.g., a graphics processing unit (GPU), a neural processing unit (NPU), an image signal processor (ISP), a sensor hub processor, or a communication processor (CP)) that is operable independently from, or in conjunction with, the main processor 321. For example, when the electronic device 301 includes the main processor 321 and the auxiliary processor 323, the auxiliary processor 323 may be adapted to consume less power than the main processor 321, or to be specific to a specified function. The auxiliary processor 323 may be implemented as separate from, or as part of the main processor 321.

The auxiliary processor 323 may control at least some of functions or states related to at least one component (e.g., the display module 360, the sensor module 376, or the communication module 390) among the components of the electronic device 301, instead of the main processor 321 while the main processor 321 is in an inactive (e.g., sleep) state, or together with the main processor 321 while the main processor 321 is in an active state (e.g., executing an application). According to an embodiment, the auxiliary processor 323 (e.g., an image signal processor or a communication processor) may be implemented as part of another component (e.g., the camera module 380 or the communication module 390) functionally related to the auxiliary processor 323. According to an embodiment, the auxiliary processor 323 (e.g., the neural processing unit) may include a hardware structure specified for artificial intelligence model processing. An artificial intelligence model may be generated by machine learning. Such learning may be performed, e.g., by the electronic device 301 where the artificial intelligence is performed or via a separate server (e.g., the server 308). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 330 may store various data used by at least one component (e.g., the processor 320 or the sensor module 376) of the electronic device 301. The various data may include, for example, software (e.g., the program 340) and input data or output data for a command related thereto. The memory 330 may include the volatile memory 332 or the non-volatile memory 334.

The program 340 may be stored in the memory 330 as software, and may include, for example, an operating system (OS) 342, middleware 344, or an application 346.

The input module 350 may receive a command or data to be used by another component (e.g., the processor 320) of the electronic device 301, from the outside (e.g., a user) of the electronic device 301. The input module 350 may include, for example, a microphone, a mouse, a keyboard, a key (e.g., a button), or a digital pen (e.g., a stylus pen).

The sound output module 355 may output sound signals to the outside of the electronic device 301. The sound output module 355 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 360 may visually provide information to the outside (e.g., a user) of the electronic device 301. The display module 360 may include, for example, a display, a hologram device, or a projector and control circuitry to control a corresponding one of the display, hologram device, and projector. According to an embodiment, the display module 360 may include a touch sensor adapted to detect a touch, or a pressure sensor adapted to measure the intensity of force incurred by the touch.

The audio module 370 may convert a sound into an electrical signal and vice versa. According to an embodiment, the audio module 370 may obtain the sound via the input module 350, or output the sound via the sound output module 355 or a headphone of an external electronic device (e.g., an electronic device 302) directly (e.g., wiredly) or wirelessly coupled with the electronic device 301.

The sensor module 376 may detect an operational state (e.g., power or temperature) of the electronic device 301 or an environmental state (e.g., a state of a user) external to the electronic device 301, and then generate an electrical signal or data value corresponding to the detected state. According to an embodiment, the sensor module 376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 377 may support one or more specified protocols to be used for the electronic device 301 to be coupled with the external electronic device (e.g., the electronic device 302) directly (e.g., wiredly) or wirelessly. According to an embodiment, the interface 377 may include, for example, a high definition multimedia interface (HDMI), a universal serial bus (USB) interface, a secure digital (SD) card interface, or an audio interface.

A connecting terminal 378 may include a connector via which the electronic device 301 may be physically connected with the external electronic device (e.g., the electronic device 302). According to an embodiment, the connecting terminal 378 may include, for example, a HDMI connector, a USB connector, a SD card connector, or an audio connector (e.g., a headphone connector).

The haptic module 379 may convert an electrical signal into a mechanical stimulus (e.g., a vibration or a movement) or electrical stimulus which may be recognized by a user via his tactile sensation or kinesthetic sensation. According to an embodiment, the haptic module 379 may include, for example, a motor, a piezoelectric element, or an electric stimulator.

The camera module 380 may capture a still image or moving images. According to an embodiment, the camera module 380 may include one or more lenses, image sensors, image signal processors, or flashes.

The power management module 388 may manage power supplied to the electronic device 301. According to an embodiment, the power management module 388 may be implemented as at least part of, for example, a power management integrated circuit (PMIC).

The battery 389 may supply power to at least one component of the electronic device 301. According to an embodiment, the battery 389 may include, for example, a primary cell which is not rechargeable, a secondary cell which is rechargeable, or a fuel cell.

The communication module 390 may support establishing a direct (e.g., wired) communication channel or a wireless communication channel between the electronic device 301 and the external electronic device (e.g., the electronic device 302, the electronic device 304, or the server 308) and performing communication via the established communication channel. The communication module 390 may include one or more communication processors that are operable independently from the processor 320 (e.g., the application processor (AP)) and supports a direct (e.g., wired) communication or a wireless communication. According to an embodiment, the communication module 390 may include a wireless communication module 392 (e.g., a cellular communication module, a short-range wireless communication module, or a global navigation satellite system (GNSS) communication module) or a wired communication module 394 (e.g., a local area network (LAN) communication module or a power line communication (PLC) module). A corresponding one of these communication modules may communicate with the external electronic device via the first network 398 (e.g., a short-range communication network, such as Bluetooth™, wireless-fidelity (Wi-Fi) direct, or infrared data association (IrDA)) or the second network 399 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 392 may identify and authenticate the electronic device 301 in a communication network, such as the first network 398 or the second network 399, using subscriber information (e.g., international mobile subscriber identity (IMSI)) stored in the subscriber identification module 396.

The wireless communication module 392 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 392 may support a high-frequency band (e.g., the mmWave band) to achieve, e.g., a high data transmission rate. The wireless communication module 392 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 392 may support various requirements specified in the electronic device 301, an external electronic device (e.g., the electronic device 304), or a network system (e.g., the second network 399). According to an embodiment, the wireless communication module 392 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 397 may transmit or receive a signal or power to or from the outside (e.g., the external electronic device) of the electronic device 301. According to an embodiment, the antenna module 397 may include an antenna including a radiating element implemented using a conductive material or a conductive pattern formed in or on a substrate (e.g., a printed circuit board (PCB)). According to an embodiment, the antenna module 397 may include a plurality of antennas (e.g., array antennas). In such a case, at least one antenna appropriate for a communication scheme used in the communication network, such as the first network 398 or the second network 399, may be selected, for example, by the communication module 390 (e.g., the wireless communication module 392) from the plurality of antennas. The signal or the power may then be transmitted or received between the communication module 390 and the external electronic device via the selected at least one antenna. According to an embodiment, another component (e.g., a radio frequency integrated circuit (RFIC)) other than the radiating element may be additionally formed as part of the antenna module 397.

According to certain embodiments, the antenna module 397 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 301 and the external electronic device 304 via the server 308 coupled with the second network 399. Each of the electronic devices 302 or 304 may be a device of a same type as, or a different type, from the electronic device 301. According to an embodiment, all or some of operations to be executed at the electronic device 301 may be executed at one or more of the external electronic devices 302, 304, or 308. For example, if the electronic device 301 should perform a function or a service automatically, or in response to a request from a user or another device, the electronic device 301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 301. The electronic device 301 may provide the outcome, with or without further processing of the outcome, as at least part of a reply to the request. To that end, a cloud computing, distributed computing, mobile edge computing (MEC), or client-server computing technology may be used, for example. The electronic device 301 may provide ultra-low-latency services using, e.g., distributed computing or mobile edge computing. In another embodiment, the external electronic device 304 may include an internet-of-things (IoT) device. The server 308 may be an intelligent server using machine learning and/or a neural network. According to an embodiment, the external electronic device 304 or the server 308 may be included in the second network 399. The electronic device 301 may be applied to intelligent services (e.g., smart home, smart city, smart car, or healthcare) based on 5G communication technology or IoT-related technology.

An electronic device 100 according to an embodiment of the disclosure may include a first housing 110, a second housing 120 connected with the first housing 110, a sensor module 160 that includes a sensor 166 and that is disposed in at least one of the first housing 110 or the second housing 120, and a hinge structure 200 that rotatably connects the first housing 110 and the second housing 120. The hinge structure 200 may include a first rotary member 210 that is connected to the first housing 110 and that rotates about a first axis of rotation R1 together with the first housing 110, a second rotary member 220 that is connected to the second housing 120 and that rotates about a second axis of rotation R2 together with the second housing 120, a first arm member 250 that is coupled to a first arm shaft 241 to rotate about the first arm shaft 241 and that operates in conjunction with rotation of the first rotary member 210, the first arm shaft 241 being different from the first axis of rotation R1, a second arm member 260 that is coupled to a second arm shaft 242 to rotate about the second arm shaft 242 and that operates in conjunction with rotation of the second rotary member 220, the second arm shaft 242 being different from the second axis of rotation R2, and a magnet assembly 280 that includes a magnet 281 and that is disposed on at least one of the first arm member 250 or the second arm member 260 such that at least a portion of the magnet assembly faces the sensor 166. A distance between the magnet 281 and the sensor 166 or relative positions thereof may be changed in response to a rotary motion of the first housing 110 and the second housing 120.

In certain embodiments, the hinge structure 200 may further include a fixed member 230. The first rotary member 210 may be coupled to the fixed member 230 so as to be rotatable about the first axis of rotation R1, and the second rotary member 220 may be coupled to the fixed member 230 so as to be rotatable about the second axis of rotation R2. The first arm shaft 241 and the second arm shaft 242 may be coupled to the fixed member 230 so as to be rotatable. The first arm member 250 may be configured to rotate together with the first arm shaft 241, and the second arm member 260 may be configured to rotate together with the second arm shaft 242.

In certain embodiments, the magnet assembly 280 may be disposed on the first arm member 250. The sensor module 160 may be disposed in the first housing 110 to correspond to the magnet assembly 280. The magnet assembly 280 may be configured to rotate about the first arm shaft 241 together with the first arm member 250. The sensor module 160 may be configured to rotate about the first axis of rotation R1 together with the first housing 110.

In certain embodiments, the magnet assembly 280 may further include a magnet bracket 282 in which the magnet 281 is disposed, and the magnet bracket 282 may be fixedly disposed on the first arm member 250.

In certain embodiments, the magnet bracket 282 may contain a non-metallic material or a non-magnetic material.

In certain embodiments, the magnet bracket 282 may include a receiving portion 282a in which at least a portion of the magnet 281 is accommodated and a protruding portion 282b that extends from the receiving portion, and the protruding portion 282b may pass through at least a portion of the first arm member 250 and may be coupled to the first arm member 250.

In certain embodiments, the first arm member 250 may include a first sliding pin 252 accommodated in a first sliding groove 215 formed in the first rotary member 210, and the second arm member 260 may include a second sliding pin 262 accommodated in a second sliding groove 225 formed in the second rotary member 220. The first sliding pin 252 may be configured to slide in the first sliding groove 215 as the first arm member 250 and the first rotary member 210 rotate about the first arm shaft 241 and the first axis of rotation R1, respectively. The second sliding pin 262 may be configured to slide in the second sliding groove 225 as the second arm member 260 and the second rotary member 220 rotate about the second arm shaft 242 and the second axis of rotation R2, respectively.

In certain embodiments, the first arm member 250 or the second arm member 260 may include a first coupling portion 250a to which the first arm shaft 241 or the second arm shaft 242 is coupled, a second coupling portion 250b to which the first sliding pin 252 or the second sliding pin 262 is coupled, and a third coupling portion 250c that connects the first coupling portion 250a and the second coupling portion 250b, and the magnet assembly 280 may be coupled to the third coupling portion 250c.

In certain embodiments, the electronic device may further include a display 140 disposed on the first housing 110 and the second housing 120. The first housing 110 may include a first plate 111 on which one portion of the display 140 is disposed and a first frame 112 that surrounds the first plate 111, and the second housing 120 may include a second plate 121 on which another portion of the display 140 is disposed and a second frame 122 that surrounds the second plate 121.

The hinge structure 200 may be connected to the first housing 110 and the second housing 120 such that at least a portion of the first rotary member 210 and at least a portion of the first arm member 250 overlap the first plate 111 and at least a portion of the second rotary member 220 and at least a portion of the second arm member 260 overlap the second plate 121.

In certain embodiments, the magnet assembly 280 may be disposed on the first arm member 250. The sensor module 160 may further include a flexible circuit board 161, at least a portion of which is attached to the first plate 111. The sensor 166 may be disposed on a partial area of the flexible circuit board 161 to face the magnet assembly 280.

In certain embodiments, the electronic device may further include a circuit board 151 disposed in the first housing 110 and electrically connected with the sensor module 160. The first plate 111 may include a first surface 111a on which the circuit board 151 is disposed and a second surface 111b on which the display 140 is disposed that faces away from the first surface 111a. The flexible circuit board 161 may be located on the first surface 111a.

In certain embodiments, the first arm member 250 may be located on the second surface 111b of the first plate 111, and the sensor 166 may face the magnet assembly 280 through a sensor hole 111h formed in a portion of the first plate 111.

In certain embodiments, at least a portion of the flexible circuit board 161 may be disposed on the first surface 111a to overlap the sensor hole 111h, and at least a portion of the sensor 166 may be accommodated in the sensor hole 111h.

In certain embodiments, the sensor 166 may be configured to sense a strength or direction of a magnetic field of the magnet 281 and may include a magnetic sensor or a Hall sensor.

In certain embodiments, the electronic device may include a fully folded state S3 in which a first edge P1 of the first housing 110 and a second edge P2 of the second housing 120 that are parallel to an axial direction make contact with each other, an unfolded state S1 in which a third edge P3 of the first housing 110 and a fourth edge P4 of the second housing 120 that are perpendicular to the axial direction form substantially the same straight line, and an intermediate folded state S2 defined as any state between the unfolded state S1 and the fully folded state S3. The distance between the sensor 166 and the magnet 281 may be a first distance D1 in the unfolded state S1, a second distance D2 in the intermediate folded state S2, and a third distance D3 in the fully folded state S3, and the first distance D1, the second distance D2, and the third distance D3 may differ from one another.

In certain embodiments, the sensor 166 may be configured to be located on one side with respect to a center of the magnet 281 in the unfolded state S1 and on an opposite side with respect to the center of the magnet 281 in the fully folded state S3, and the third distance D3 may be greater than the first distance D1 and the second distance D2.

In certain embodiments, the electronic device 100 may be configured to calculate a folding angle of the first housing 110 and the second housing 120, based on a strength of a magnetic field of the magnet 281 detected by the sensor 166, and the folding angle may be defined as an angle between the first housing 110 and the second housing 120.

An electronic device 100 according to an embodiment of the disclosure may include a first housing 110, a second housing 120 connected with the first housing 110, a flexible display 140 that extends from the first housing 110 to the second housing 120, a hinge structure 200 that rotatably connects the first housing 110 and the second housing 120, and a sensor 166 that is disposed in the first housing 110 and that senses a strength or direction of a magnetic field. The hinge structure 200 may include a fixed member 230, a first rotary member 210 coupled to the fixed member 230 so as to be rotatable about a first axis of rotation R1 and connected to the first housing 110 to rotate together with the first housing 110, a second rotary member 220 coupled to the fixed member 230 so as to be rotatable about a second axis of rotation R2 and connected to the second housing 120 to rotate together with the second housing 120, a first arm shaft 241 that is coupled to the fixed member 230 so as to be rotatable and that is parallel to the first axis of rotation R1, a second arm shaft 242 that is coupled to the fixed member 230 so as to be rotatable and that is parallel to the second axis of rotation R2, a first arm member 250 that is coupled to the first arm shaft 241 and that rotates together with the first arm shaft 241, the first arm member 250 including a first cam 251 that surrounds the first arm shaft 241, a second arm member 260 that is coupled to the second arm shaft 242 and that rotates together with the second arm shaft 242, the second arm member 260 including a second cam 261 that surrounds the second arm shaft 242, a cam member 270 that is coupled to the first arm shaft 241 and the second arm shaft 242 and is linearly movable in an axial direction and that includes a third cam 271 engaged with the first cam 251 and a fourth cam 272 engaged with the second cam 261, a first elastic member 291a that is coupled to the first arm shaft 241 and that provides an elastic force to the cam member 270 in the axial direction, a second elastic member 291b that is coupled to the second arm shaft 242 and that provides an elastic force to the cam member 270 in the axial direction, and a magnet assembly 280 that includes a magnet 281 and that is coupled to the first arm member 250 to partially face the sensor 166. In folding and unfolding motions of the electronic device 100, the first arm member 250 may operate in conjunction with rotation of the first rotary member 210 and may rotate along a path different from a path of the first rotary member 210, and the second arm member 260 may operate in conjunction with rotation of the second rotary member 220 and may rotate along a path different from a path of the second rotary member 220. A distance between the magnet 281 and the sensor 166 may be changed in response to the folding and unfolding motions.

In certain embodiments, the magnet assembly 280 may further include a magnet bracket 282 coupled to the first arm member 250, and the magnet 281 may be accommodated in a receiving space 2821 of the magnet bracket 282.

In certain embodiments, the first arm member 250 may partially contain a metallic material, and a portion of the magnet bracket 282 that makes contact with the first arm member 250 may be formed of a non-metallic material or a non-magnetic material.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 340) including one or more instructions that are stored in a storage medium (e.g., internal memory 336 or external memory 338) that is readable by a machine (e.g., the electronic device 301). For example, a processor (e.g., the processor 320) of the machine (e.g., the electronic device 301) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device, comprising:
   a first housing;
   a second housing;
   a sensor module including a sensor, the sensor module disposed in the first housing; and
   a hinge structure rotatably connecting the first housing and the second housing,
   wherein the hinge structure includes:
   a first rotary member connected to the first housing and configured to rotate about a first axis of rotation together with the first housing;
   a second rotary member connected to the second housing and configured to rotate about a second axis of rotation together with the second housing;
   a first arm member coupled to and rotatable about a first arm shaft, the first arm member configured to operate in conjunction with rotation of the first rotary member, wherein a rotational axis of the first arm shaft is substantially parallel to and spaced apart from the first axis of rotation;
   a second arm member coupled and rotatable about a second arm shaft, the second arm member configured to operate in conjunction with rotation of the second rotary member, wherein a rotational axis of the second arm shaft is substantially parallel to and spaced apart from the second axis of rotation; and
   a magnet assembly including a magnet, the magnet assembly disposed on the first arm member such that at least a portion of the magnet assembly faces the sensor, and
   wherein a distance between the magnet and the sensor in the first housing is changed in response to rotation of the first housing and the second housing.

2. The electronic device of claim 1, wherein the hinge structure further includes a fixed member,
   wherein the first rotary member is coupled to the fixed member so as to be rotatable about the first axis of rotation,
   wherein the second rotary member is coupled to the fixed member so as to be rotatable about the second axis of rotation,
   wherein the first arm shaft and the second arm shaft are coupled to the fixed member so as to be rotatable,
   wherein the first arm member is configured to rotate together with the first arm shaft, and
   wherein the second arm member is configured to rotate together with the second arm shaft.

3. The electronic device of claim 1, wherein the magnet assembly further includes a magnet bracket in which the magnet is disposed, and
   wherein the magnet bracket is fixedly disposed on the first arm member.

4. The electronic device of claim 3, wherein the magnet bracket includes a non-metallic material or a non-magnetic material.

5. The electronic device of claim 3, wherein the magnet bracket includes a receiving portion in which at least a portion of the magnet is accommodated, and a protruding portion extending from the receiving portion, and
   wherein the protruding portion passes through at least a portion of the first arm member and is coupled to the first arm member.

6. The electronic device of claim 1, wherein the first arm member includes a first sliding pin accommodated in a first sliding groove formed in the first rotary member,
   wherein the second arm member includes a second sliding pin accommodated in a second sliding groove formed in the second rotary member,
   wherein the first sliding pin slides in the first sliding groove as the first arm member and the first rotary member rotate about the first arm shaft and the first axis of rotation, respectively, and
   wherein the second sliding pin slides in the second sliding groove as the second arm member and the second rotary member rotate about the second arm shaft and the second axis of rotation, respectively.

7. The electronic device of claim 6, wherein the first arm member or the second arm member includes:
   a first coupling portion to which the first arm shaft or the second arm shaft is coupled;
   a second coupling portion to which the first sliding pin or the second sliding pin is coupled; and
   a third coupling portion configured to connect the first coupling portion and the second coupling portion, and
   wherein the magnet assembly is coupled to the third coupling portion.

8. The electronic device of claim 1, further comprising:
   a display disposed on the first housing and the second housing,
   wherein the first housing includes a first plate on which one portion of the display is disposed and a first frame configured to at least partially surround the first plate,
   wherein the second housing includes a second plate on which another portion of the display is disposed and a second frame configured to at least partially surround the second plate, and
   wherein the hinge structure is operably connected to the first housing and the second housing such that at least a portion of the first rotary member and at least a portion of the first arm member overlap the first plate, and at least a portion of the second rotary member and at least a portion of the second arm member overlap the second plate.

9. The electronic device of claim 8, wherein the magnet assembly is disposed on the first arm member,
   wherein the sensor module further includes a flexible circuit board, at least a portion of which is attached to the first plate, and
   wherein the sensor is disposed on a partial area of the flexible circuit board to face the magnet assembly.

10. The electronic device of claim 9, further comprising:
a circuit board different from the flexible circuit board, the circuit board disposed in the first housing, and electrically connected with the sensor module,
wherein the first plate includes a first surface on which the circuit board is disposed and a second surface on which the display is disposed, the second surface disposed so as to face away from the first surface, and
wherein the flexible circuit board is located on the first surface of the first plate.

11. The electronic device of claim 10, wherein the first arm member is disposed on the second surface of the first plate, and
wherein the sensor is exposed to the magnet assembly through a sensor hole formed in a portion of the first plate.

12. The electronic device of claim 11, wherein at least a portion of the flexible circuit board is disposed on the first surface to overlap the sensor hole, and
wherein at least a portion of the sensor is disposed in the sensor hole.

13. The electronic device of claim 1, wherein the sensor is configured to detect a strength and/or direction of a magnetic field of the magnet, and includes a magnetic sensor or a Hall sensor.

14. The electronic device of claim 1, wherein the electronic device is deformable into:
a fully folded state in which a first edge of the first housing and a second edge of the second housing that are parallel to the first and/or second axis of rotation contact with each other;
an unfolded state in which a third edge of the first housing and a fourth edge of the second housing that are both perpendicular to the first and/or second axis and together form a substantially straight line; and
an intermediate folded state including disposition of the first and second housings at any respective angle between the unfolded state and the fully folded state,
wherein the distance between the sensor and the magnet is a first distance in the unfolded state, a second distance in the intermediate folded state, and a third distance in the fully folded state, and
wherein the first distance, the second distance, and the third distance differ from one another.

15. The electronic device of claim 14, wherein the sensor is located on one side with respect to a center of the magnet in the unfolded state, and on an opposite side with respect to the center of the magnet in the fully folded state, and
wherein the third distance is greater than the first distance and the second distance.

16. The electronic device of claim 1, wherein the electronic device is configured to calculate a folding angle of the first housing and the second housing based on a strength of a magnetic field of the magnet detected by the sensor, and
wherein the folding angle is defined as an angle between the first housing and the second housing.

17. The electronic device of claim 1, wherein the first rotary member and the second rotary member are spaced apart.

18. An electronic device comprising:
a first housing;
a second housing;
a flexible display spanning the first housing to the second housing;
a hinge structure rotatably connecting the first housing and the second housing; and
a sensor disposed in the first housing, and configured to detect a strength and/or direction of a magnetic field,
wherein the hinge structure includes:
a fixed member;
a first rotary member coupled to the fixed member so as to be rotatable about a first axis of rotation, the first rotary member operably connected to the first housing to rotate together with the first housing;
a second rotary member coupled to the fixed member so as to be rotatable about a second axis of rotation, the second rotary member operably connected to the second housing to rotate together with the second housing;
a first arm shaft coupled to the fixed member so as to be rotatable, the first arm shaft disposed parallel to the first axis of rotation;
a second arm shaft coupled to the fixed member so as to be rotatable, the second arm shaft disposed parallel to the second axis of rotation;
a first arm member coupled to the first arm shaft and rotatable together with the first arm shaft, wherein the first arm member includes a first cam at least partially surrounding the first arm shaft;
a second arm member coupled to the second arm shaft and rotatable together with the second arm shaft, wherein the second arm member includes a second cam at least partially surrounding the second arm shaft;
a cam member coupled to the first arm shaft and the second arm shaft and linearly movable in an axial direction parallel to the first and/or second axis of rotation, the cam member including a third cam engaged with the first cam, and a fourth cam engaged with the second cam;
a first elastic member coupled to the first arm shaft and providing elastic force to the cam member in the axial direction;
a second elastic member coupled to the second arm shaft and providing elastic force to the cam member in the axial direction; and
a magnet assembly including a magnet, the magnet assembly coupled to the first arm member so as to partially face the sensor,
wherein in folding and unfolding motions of the electronic device, the first arm member operates in conjunction with rotation of the first rotary member and rotates along a path different from that of the first rotary member, and the second arm member operates in conjunction with rotation of the second rotary member and rotates along a path different from that of the second rotary member, and
wherein a distance between the magnet and the sensor changes according to the folding and unfolding motions.

19. The electronic device of claim 18, wherein the magnet assembly further includes a magnet bracket coupled to the first arm member, and
wherein the magnet is disposed in a receiving space of the magnet bracket.

20. The electronic device of claim 19, wherein the first arm member at least partially includes a metallic material, and wherein a portion of the magnet bracket contacting with the first arm member includes a non-metallic material or a non-magnetic material.

\* \* \* \* \*